United States Patent
Fan et al.

(10) Patent No.: US 10,558,524 B2
(45) Date of Patent: Feb. 11, 2020

(54) COMPUTING SYSTEM WITH DATA RECOVERY MECHANISM AND METHOD OF OPERATION THEREOF

(71) Applicant: CNEX LABS, Inc., San Jose, CA (US)

(72) Inventors: Bing Fan, San Diego, CA (US);
Xiaojie Zhang, Saratoga, CA (US)

(73) Assignee: CNEX LABS, Inc., San Jose, CA (US)

( * ) Notice: Subject to any disclaimer, the term of this patent is extended or adjusted under 35 U.S.C. 154(b) by 0 days.

(21) Appl. No.: 15/204,408

(22) Filed: Jul. 7, 2016

(65) Prior Publication Data
US 2017/0185481 A1    Jun. 29, 2017

Related U.S. Application Data

(60) Provisional application No. 62/272,471, filed on Dec. 29, 2015.

(51) Int. Cl.
| | |
|---|---|
| *G06F 11/10* | (2006.01) |
| *G06F 3/06* | (2006.01) |
| *H03M 13/15* | (2006.01) |
| *H03M 13/13* | (2006.01) |
| *H03M 13/37* | (2006.01) |

(52) U.S. Cl.
CPC .......... *G06F 11/1076* (2013.01); *G06F 3/064* (2013.01); *G06F 3/0619* (2013.01); *G06F 3/0689* (2013.01); *H03M 13/13* (2013.01); *H03M 13/154* (2013.01); *H03M 13/3761* (2013.01)

(58) Field of Classification Search
CPC .................................................. G06F 11/1076
See application file for complete search history.

(56) References Cited

U.S. PATENT DOCUMENTS

| | | | | |
|---|---|---|---|---|
| 4,796,260 | A * | 1/1989 | Schilling | H03M 13/05 714/755 |
| 4,847,842 | A * | 7/1989 | Schilling | H03M 13/29 714/755 |
| 4,849,976 | A * | 7/1989 | Schilling | H03M 13/29 714/751 |
| 5,351,246 | A * | 9/1994 | Blaum | G06F 11/1092 714/6.21 |
| 5,993,056 | A * | 11/1999 | Vaman | H03M 13/11 714/755 |
| 6,182,264 | B1 * | 1/2001 | Ott | H03M 13/09 714/774 |
| 2003/0070042 | A1 * | 4/2003 | Byrd | G06F 11/1076 711/114 |

(Continued)

OTHER PUBLICATIONS

U.S. Appl. No. 15/204,485, filed Jul. 7, 2016, CNEX LABS, INC.

*Primary Examiner* — Steve N Nguyen
(74) *Attorney, Agent, or Firm* — Perspectives Law Group, Corp.

(57) ABSTRACT

A computing system includes an array of storage devices configured to store storage data and check data; and a storage engine, coupled to the array of storage devices, configured to: access the storage data, detect an erasure storage data, an erasure check data, or a combination thereof when the storage data is not accessible from the array of storage devices, and recover the storage data from the erasure storage data, the erasure check data, or the combination thereof by applying at least one of a block of check data including a slope from the check data.

20 Claims, 12 Drawing Sheets

(56) References Cited

U.S. PATENT DOCUMENTS

2015/0378820 A1 12/2015 Doerner
2016/0011941 A1 1/2016 He et al.
2016/0110264 A1 4/2016 Mehta et al.
2016/0132258 A1 5/2016 Joshi et al.
2016/0134703 A1 5/2016 Ori

* cited by examiner

COMPUTING SYSTEM WITH DATA RECOVERY MECHANISM AND METHOD OF OPERATION THEREOF

CROSS-REFERENCE TO RELATED APPLICATION(S)

This application claims the benefit of U.S. Provisional Patent Application Ser. No. 62/272,471 filed Dec. 29, 2015, and the subject matter thereof is incorporated herein by reference thereto.

This application contains subject matter related to a concurrently filed U.S. Patent Applications by Xiaojie Zhang and Bing Fan titled "COMPUTING SYSTEM WITH CIRCULAR-SHIFT RECOVERY MECHANISM AND METHOD OF OPERATION THEREOF". The related application is assigned to CNEX LABS, INC. and is identified by application Ser. No. 15/204,485. The subject matter thereof is incorporated herein by reference thereto.

TECHNICAL FIELD

An embodiment of the present invention relates generally to a computing system, and more particularly to a system with erasure coding.

BACKGROUND

Modern consumer and industrial electronics, especially devices such as graphical computing systems, televisions, projectors, cellular phones, portable digital assistants, and combination devices, are providing increasing levels of functionality to support modern life. Research and development in the existing technologies can take a myriad of different directions. As information usage increases and becomes more pervasive, existing and new systems require interoperation and information reliability. This increasing information usage can include some loss of information or data. Often only a partial loss of information or data occurs.

Thus, a need still remains for a computing system with data recovery mechanism to provide improved information or data reliability including information or data recovery. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a computing system including: an array of storage devices configured to store storage data and check data; and a storage engine, coupled to the array of storage devices, configured to: access the storage data, detect an erasure storage data, an erasure check data, or a combination thereof when the storage data is not accessible from the array of storage devices, and recover the storage data from the erasure storage data, the erasure check data, or the combination thereof by applying at least one of a block of check data including a slope from the check data.

An embodiment of the present invention provides a method of operation of a computing system including: storing storage data and check data in an array of storage devices; accessing the storage data from the array of storage devices; detecting an erasure storage data, an erasure check data, or a combination thereof when the storage data is not accessible from the array of storage devices; and recovering the storage data from the erasure storage data, the erasure check data, or the combination thereof by applying at least one of a block of check data including a slope from the check data.

An embodiment of the present invention provides a non-transitory computer readable medium including instructions for execution, the medium including: storing storage data and check data in an array of storage devices; accessing the storage data from the array of storage devices; detecting an erasure storage data, an erasure check data, or a combination thereof when the storage data is not accessible from the array of storage devices; and recovering the storage data from the erasure storage data, the erasure check data, or the combination thereof by applying at least one of a block of check data including a slope from the check data.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
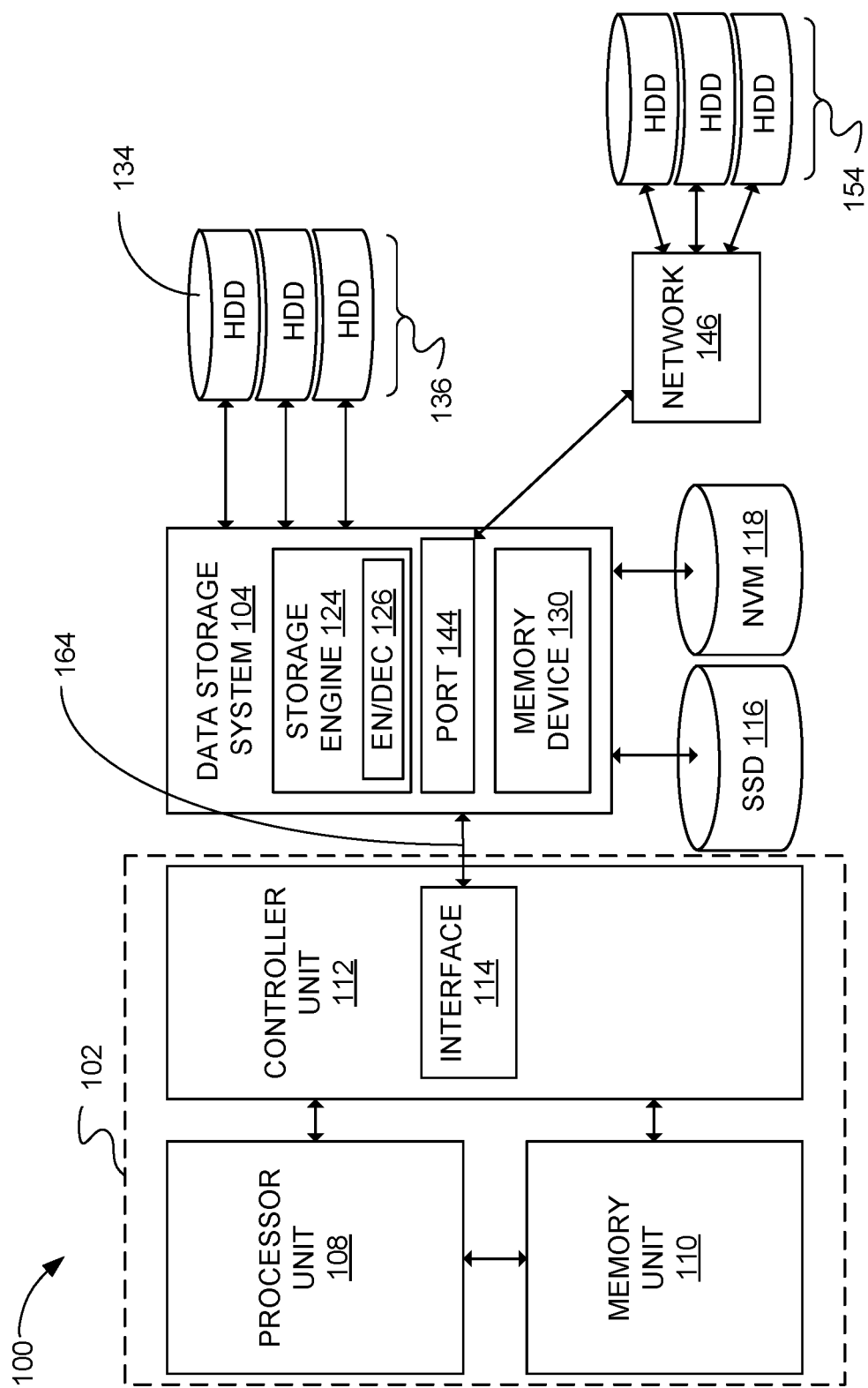
FIG. 1 is a computing system with erasure code mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or combination thereof in an embodiment of the present invention in accordance with the context in which the term is used. For example, the software can be machine code, firmware, embedded code, and application software. Also for example, the hardware can be circuitry, transistors, processor, computer, integrated circuit, integrated circuit cores, a sensor, a microelectromechanical system (MEMS), passive devices, or combination thereof. Further, if a module is written in the apparatus claims section below, the modules are deemed to include hardware circuitry for the purposes and the scope of apparatus claims. The term "unit" referred to herein can include hardware only implementations, where performance requirements preclude the use of software.

Referring now to FIG. 1, therein is shown a computing system 100 with data recovery mechanism in an embodiment of the present invention. The computing system 100 with data recovery mechanism can provide recovery of erased, erroneous, or missing information or data such as any data including parity or check information or data that is not available. The computing system 100 can be represented as a functional block diagram with the computing system 100 including a host computer 102 with a data storage system 104. The functional block diagram can include the data storage system 104 coupled to the host computer 102 such as a desk top computer, laptop computer, server, workstation, or computer cluster.

The host computer 102 can include at least a processor 108 such as a host central processing unit with one or more processors, a memory unit 110 such as a host memory coupled to the processor 108, and a controller 112 such as host bus controller. The controller 112 can provide an interface 114 such as a host interface bus, which can allow the host computer 102 to access or utilize the data storage system 104. The interface 114 can be implemented as hardware including electronic circuitry, transistors, integrated circuits, an integrated circuit core, a processor, electronic passive devices, or combination thereof. The interface 114 can also be implemented with the hardware operating software, machine code, firmware, embedded code, application software, or combination thereof.

In some embodiments, functions of the controller 112 can be provided by the processor 108. The processor 108 can be implemented with hardware circuitry in a number of different combinations or structures. For example, the processor 108 can be a processor, an application specific integrated circuit (ASIC) an embedded processor, a microprocessor, a hardware control logic, a hardware finite state machine (FSM), a digital signal processor (DSP), or combination thereof.

The data storage system 104 can include or can be coupled to a solid state disk 116, such as a non-volatile memory based storage device including a peripheral interface system, a non-volatile memory 118, such as an internal memory card for expanded or extended non-volatile system memory, or a combination thereof. The data storage system 104 can also include or can be coupled to a hard disk drive (HDD) 134 that can be mounted in the host computer 102, external to the host computer 102, or combination thereof. For example, the solid state disk 116, the non-volatile memory 118, and the hard disk drive 134 can be considered as direct attached storage (DAS) devices. An array of storage devices 136 can be formed of a plurality of the hard disk drive 134. It is understood that the array of storage devices 136 can include a plurality of the solid state disk 116, the hard disk drive 134, or a combination thereof.

The data storage system 104 can also include a network attach port 144 for coupling a network 146. For example, the network 146 can be a local area network (LAN), a storage area network (SAN), or combination thereof. The network attach port 144 can provide access to network attached storage (NAS) array 154. It is understood that the network attached storage (NAS) array 154 can include a plurality of the solid state disk 116, the hard disk drive 134, or a combination thereof. It is further understood that the network 146 can include Internet access and support a storage cloud structure.

For illustrative purposes, the network attached storage array 154 are shown as a plurality of the hard disk drive 134, although it is understood that the network attached storage array 154 can include magnetic tape storage (not shown), storage devices similar to the solid state disk 116, storage devices similar to the non-volatile memory 118, storage devices similar to the hard disk drive 134, or combination thereof, that can be accessed through the network attach port 144, the network 146, or combination thereof. The network attached storage array 154 can also include just a bunch of disks (JBOD) systems or redundant array of intelligent disks (RAID) systems, other network attached storage array 154, or combination thereof.

The data storage system 104 can be coupled to the interface 114, for providing access to multiple of the direct attached storage (DAS) devices, with a cable 164 for a storage interface, such as Serial Advanced Technology Attachment (SATA), the Serial Attached SCSI (SAS), or the Peripheral Component Interconnect-Express (PCI-e) attached storage devices. The cable 164 can couple one or more of the data storage system 104. It is understood that the data storage system 104 can be installed in a server farm that can support many of the data storage system 104 for processing large data structures. The critical nature of the data reliability can be a key aspect of the data storage system 104.

The data storage system 104 can include a storage engine 124, with an encode/decode unit 126, and a memory device 130. The storage engine 124 can be implemented with hardware circuitry, software, or combination thereof in a number of ways, combinations, or structures. For example, the storage engine 124 can be implemented as a processor, an application specific integrated circuit (ASIC) an embedded processor, a microprocessor, a hardware control logic, a hardware finite state machine (FSM), a digital signal processor (DSP), or combination thereof.

The storage engine 124 can control the flow and management of data to and from the host computer 102, from and to the direct attached storage (DAS) devices, from and to the network attached storage array 154, or combination thereof. The storage engine 124 can also perform data reliability checks and corrections. The encode/decode unit 126 can be controlled by the storage engine 124. The encode/decode unit 126 can be a hardware device configured to implement an erasure code of the storage data, such as a forward error correction code. The encode/decode unit 126 can encode any storage data written to the solid state disk 116, the non-volatile memory 118, the array of storage devices 136, the network attached storage array 154, or the combination thereof. The encode/decode unit 126 can decode and recover any of the storage data, that uses the erasure code, read from the solid state disk 116, the non-volatile memory 118, the array of storage devices 136, the network attached storage array 154, or the combination thereof.

The storage engine 124 can also control and manage flow of data between the direct attached storage (DAS) devices, the array of storage devices 136, the network attached storage array 154, amongst any of the devices, or combination thereof. The storage engine 124 can process all of the used data through the encode/decode unit 126 for segmenting the user data and generating check data for correcting any erasure corruption that might occur.

For illustrative purposes, the storage engine 124 is shown as part of the data storage system 104, although the storage engine 124 can be implemented or partitioned differently. For example, the storage engine 124 can be implemented within the host computer 102, implemented partially with software and partially implemented in hardware, or a combination thereof. The storage engine 124 can also be external to the data storage system 104.

For example, the storage engine 124 can be part of the direct attached storage (DAS) devices described above, the network attached storage array 154, or combination thereof. The functions or functionalities of the storage engine 124 can also be distributed as part of the host computer 102, the direct attached storage (DAS) devices, the network attached storage array 154, or combination thereof.

The memory device 130 can function as a local cache to the data storage system 104, the computing system 100, or combination thereof. The memory device 130 can include a volatile memory, a nonvolatile memory, or combination thereof. For example, the volatile memory can include static random access memory (SRAM), dynamic random access memory (DRAM), or combination thereof. The memory device 130 can be used by the encode/decode unit 126 during the encoding of the storage data, decoding of the storage data, and during recovery of the storage data.

For illustrative purposes, the data storage system 104 is shown coupled to the host computer 102, although it is understood that the data storage system 104 can be implemented and partitioned differently. For example, the data storage system 104 can be implemented as a plug-in card in the host computer 102, as part of a chip or chipset in the host computer 102, as partially implemented in software and partially implemented in hardware in the host computer 102, or combination thereof. The data storage system 104 can be coupled to the host computer 102 through the network 146.

For example, the data storage system 104 can be part of the direct attached storage (DAS) devices described above, the network attached storage array 154, or combination thereof. The data storage system 104 can be distributed as part of the host computer 102, the direct attached storage (DAS) devices, the network attached storage array 154, or combination thereof.

Figure 2:
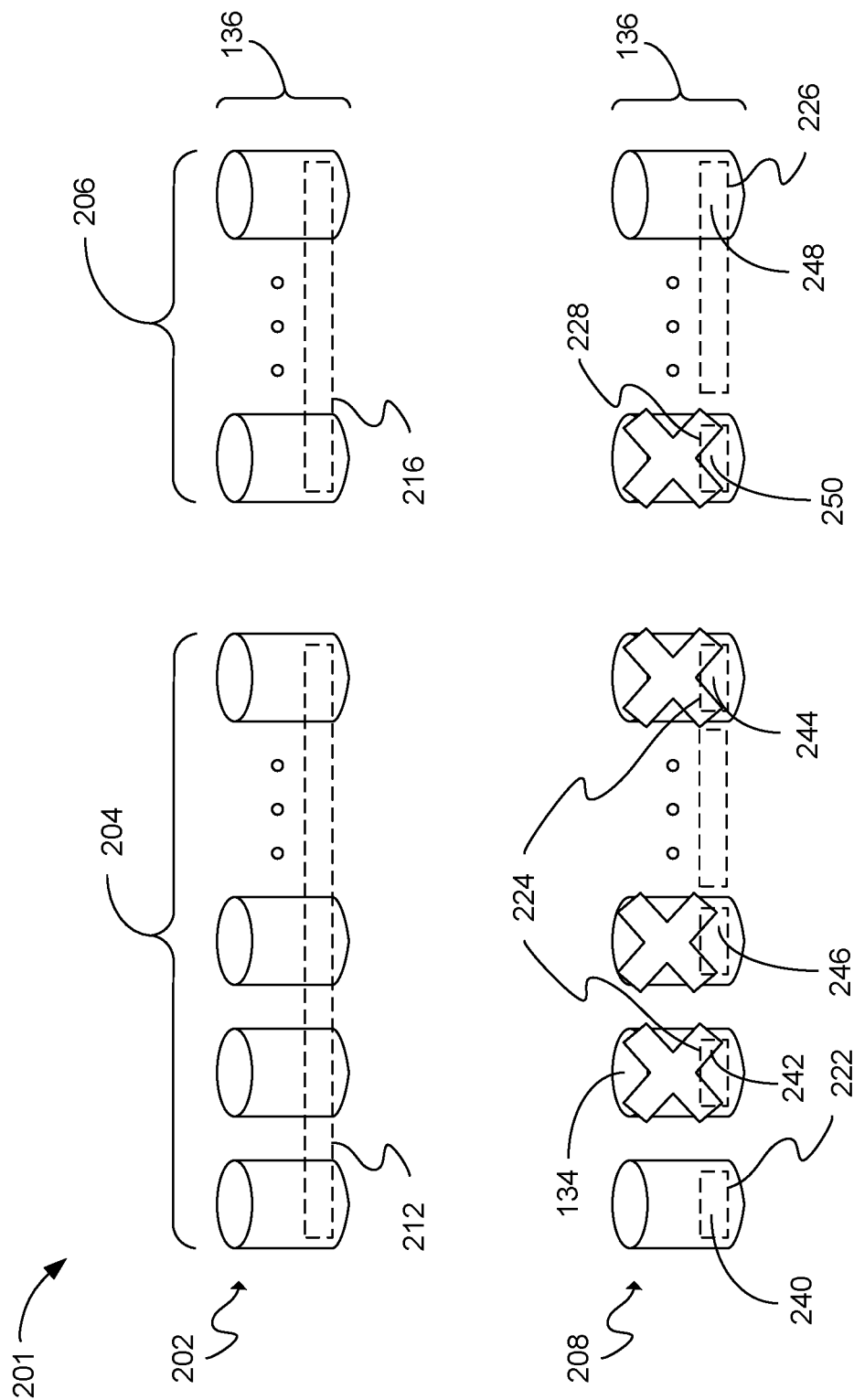
FIG. 2 is an architectural block diagram of storage media configuration for the computing system in an embodiment.

Referring now to FIG. 2, therein is shown an architectural block diagram of storage media configuration 201 for the computing system 100 in an embodiment. The architectural block diagram of storage media configuration 201 can depict the solid state disk 116, the non-volatile memory 118, the array of storage devices 136, the network attached storage array 154, or the combination thereof configured to stripe a storage data 212 and a check data 216. The storage media configuration 201 can be a random array of independent disks (RAID) formed by the solid state disk 116, the non-volatile memory 118, the array of storage devices 136, the network attached storage array 154, or the combination. The storage media configuration 201 can differ from a RAID configuration by the number of volumes storing the check data 218.

By way of an example, a first phase 202 can include the array of storage devices 136 such as a group of data disks 204 and a group of check disks 206 without erasures. After continued use of the data disks 204 and the check disks 206, the storage data 212 and the check data 216 can suffer increasing degrees of corruption, which can be caused by electrical, mechanical, or magnetic failures in the storage media configuration 201. Continuing the example, a second phase 208 can include the array of storage devices 136 such as the group of the data disks 204 and a group of the check disks 206 with erasures or missing data such as any data including parity or check data. It is understood that the erasures or missing data can be caused by device failure, electrical damage, electrical interference, magnetic erasure, or the like.

The first phase 202 can include the storage data 212 stored on more than one of the hard disk drives 134. As examples, the storage data 212 can include first user data, erasure code padding data, or combination thereof. Examples for the check data 216 can include first error correction information, consistency information, consistency data, check data, checksum, parity data, parity bit, or combination thereof. The storage data 212 can be a data file of considerable size and can include a plurality of data blocks or sectors of data.

The second phase 208 can include persistent storage data 222, such as data block $X_0$ 240, which is a readable portion of the storage data 212 that was not impacted by the erasures or the missing data. Erasure storage data 224 can refer to portions of the storage data 212 missing or erasure data denoted by a symbol in a shape of an "x". The erasure storage data 224 can include any portion of the storage data 212 that is unreadable for any reason, such as data block $X_a$ 242, data block $X_b$ 244, and data block $X_{n-1}$ 246 each have been erased. The erasure storage data 224 can be caused by failure of one or more of the hard disk drive 134.

The second phase 208 can also include persistent check data 226 with a portion of the check data 216 missing such as erasure check data 228, such as an $N+1^{st}$ parity block 250, denoted by a symbol in a shape of an "x". The computing system 100 with data recovery mechanism can recover lost data including the erasure storage data 224, the erasure check data 228, or combination thereof. The data recovery mechanism is described further below in subsequent figure descriptions.

For illustrative purposes, the array of storage devices 136 is shown having four or more of the data disks 204 with the persistent storage data 222, the erasure storage data 224, or combination thereof, although it is understood that the computing system 100 may include any number of the data disks 204. Further for illustrative purposes, the array of storage devices 136 is shown having two or more check data disks 206 with the check data 216, the erasure check data 228, or combination thereof, although it is understood that the computing system 100 may include any number of the data disks 204. The erasure storage data 224 and the erasure check data 228 can each be one or more of the data blocks or sectors of data that make-up the storage data 212.

Also for illustrative purposes, the computing system 100 is described with the hard disks 134, although it is understood that the description in FIG. 2 can apply to other types of storage devices. For example, the description in FIG. 2 can be applicable to the network attached storage array 154 of FIG. 1, the direct attached storage devices as described in FIG. 1, the memory device 130 of FIG. 1, the solid state disk 116 of FIG. 1, or combination thereof.

The functions of embodiments described in this application can be implemented as instructions stored on a non-transitory computer readable medium to be executed by the host computer 102 of FIG. 1, the data storage system 104 of FIG. 1, the storage engine 124 of FIG. 1, or combination thereof. The non-transitory computer medium can include the host memory 110 of FIG. 1, the direct attached storage devices 134, the network attached storage array 154 of FIG. 1, the non-volatile memory 118 of FIG. 1, the memory devices 130 of FIG. 1, the solid state disk 116 of FIG. 1, the hard disk drive 134, or combination thereof. The non-transitory computer readable medium can include compact disk (CD), digital video disk (DVD), or universal serial bus (USB) flash memory devices. The non-transitory computer readable medium can be integrated as a part of the computing system 100 or installed as a removable portion of the computing system 100.

Figure 3:
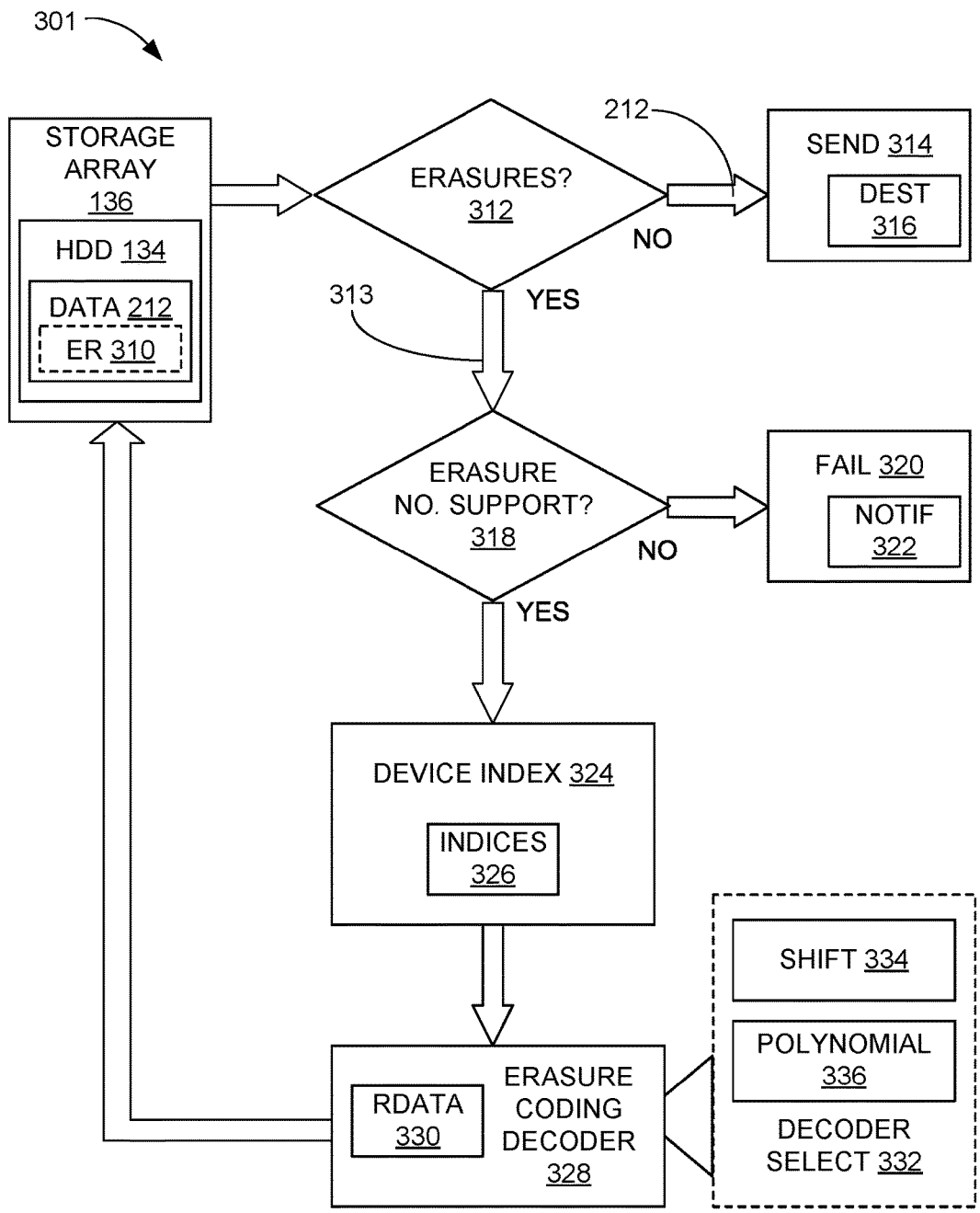
FIG. 3 is a flow diagram of data recovery process for the computing system in an embodiment.

Referring now to FIG. 3, therein is shown a flow diagram of data recovery process 301 for the computing system 100 in an embodiment. The flow diagram of data recovery process 301 depicts phases of erasure detection and decoding. The hard disk drive 134 can be a portion of the array of storage devices 136 in or interacting with the host computer 102 of FIG. 1. The array of storage devices 136, can include the hard disk drives 134, a group or an array of the hard disk drives 134, the storage engine 124 of FIG. 1, the memory device 130 of FIG. 1, the solid state disk 116 of FIG. 1, the controller unit 112 of FIG. 1, the network attached storage array 154 of FIG. 1, the direct attached storage devices as described in FIG. 1, or combination thereof.

The array of storage devices 136 and the hard disk drives 134 can be implemented in hardware including electronic circuitry, transistors, integrated circuits, an integrated circuit core, a processor, electronic passive devices, or combination thereof. The array of storage devices 136 and the hard disk drives 134 can also be partially implemented with the hardware operating software, machine code, firmware, embedded code, application software, or combination thereof. Further, the array of storage devices 136 and the hard disk drives 134 can be storage, memory, volatile memory, non-volatile memory, volatile storage, non-volatile storage, or combination thereof.

The array of storage devices 136 can provide the storage data 212 of the hard disk drives 134, which can include the storage data 212 of FIG. 2. The storage data 212 can be processed to determine whether the storage data 212 includes any data errors 310 including erased or missing information, ECC correctable data errors, or failed hardware data errors, such as the erasure storage data 224 of FIG. 2, the erasure check data 228 of FIG. 2, or combination thereof.

An erasures check process 312 such as an erasure decision process, can determine whether any of the data errors 310 are included in the storage data 212. The erasures check process 312 can be implemented with hardware including electronic circuitry, transistors, integrated circuits, an integrated circuit core, a processor, electronic passive devices, or combination thereof. The erasures check process 312 can also be implemented with the hardware operating software, machine code, firmware, embedded code, application software, or combination thereof. The erasures check process 312 can correct any of the ECC correctable data errors 310 prior to sending the storage data 212 to the next step.

The erasures check process 312 can determine whether the storage data 212, without the data errors 310, can be provided to a send process 314 for a destination 316. The send process 314 can transfer the storage data 212, not containing the data errors 310, to the destination 316 such as the host computer 102 of FIG. 1. The send process 314 can be implemented with hardware including electronic circuitry, transistors, integrated circuits, an integrated circuit core, a processor, electronic passive devices, or combination thereof. The send process 314 can also be implemented with the hardware operating software, machine code, firmware, embedded code, application software, or combination thereof.

The erasures check process 312 can transfer any error data 313, including the storage data 212 with the data errors 310, an erasure number process 318 to determine whether the error data 313 can be processed based on a number or quantity of the data errors 310 that can be supported by the encoding process of the computing system 100. The erasure number process 318 can determine the quantity, type, location, or combination thereof, of the data errors 310, which can include the erasure storage data 224, the erasure check data 228, or combination thereof. The erasure number process 318 can be implemented with hardware including electronic circuitry, transistors, integrated circuits, an integrated circuit core, a processor, electronic passive devices, or combination thereof. The erasure number process 318 can also be implemented with the hardware operating software, machine code, firmware, embedded code, application software, or combination thereof.

The erasure number process 318 can determine whether the number of the data errors 310 exceeds the number supported by the encoding process and a failure or uncorrectable data error can be reported in a failure process 320. The failure process 320 can provide a notification 322 such as a response, report, code, or combination thereof to the host computer 102 for error recovery through other means.

The erasure number process 318 can determine that the number of erasures does not exceed the encoding process and can provide the storage data 212 to a device index process 324 to initiate the data recovery. The device index process 324 such as a recovery indices process can determine indices 326 of the data errors 310 including the erasure storage data 224, the erasure check data 228, or combination thereof. The device index process 324 can be implemented with hardware including electronic circuitry, transistors, integrated circuits, an integrated circuit core, a processor, electronic passive devices, or combination thereof. The device index process 324 can also be implemented with the hardware operating software, machine code, firmware, embedded code, application software, or combination thereof.

The device index process 324 can provide indices 326, including the location of the erasure storage data 224, the erasure check data 228, or combination thereof, to an erasure coding decoder 328. The erasure coding decoder 328 can receive the indices 326 to decode the data errors 310, which can include the erasure storage data 224, the erasure check data 228, or combination thereof. The erasure coding decoder 328 can be implemented with hardware including electronic circuitry, transistors, integrated circuits, an integrated circuit core, a processor, electronic passive devices, or combination thereof. The erasure coding decoder 328 can also be implemented with the hardware operating software, machine code, firmware, embedded code, application software, or combination thereof.

The erasure coding decoder 328 can provide recovered data 330, such as regenerated data for the data errors 310, which can include the erasure storage data 224, the erasure check data 228, or combination thereof, to the array of storage devices 136. The array of storage devices 136 can receive the recovered data 330 for one or more of the hard disk drives 134 including the full context of the storage data 212.

The erasure coding decoder 328 can include decoder selector 332 which can access a shift decoder 334, a polynomial decoder 336, or a combination thereof. The decoder selector 332 can be implemented in hardware including electronic circuitry, transistors, integrated circuits, an integrated circuit core, a processor, electronic passive devices, or combination thereof. The decoder selector 332 can also be implemented with the hardware operating software, machine code, firmware, embedded code, application software, or combination thereof. For illustrative purposes, the decoder selector 332 is shown having decoders for two of the encoding techniques although it is understood that any number or combination of decoders may be implemented.

The erasure coding decoder 328 can select the shift decoder 334 or the polynomial decoder 336 that matches the storage data 212. The shift decoder 334 or the polynomial decoder 336 can provide sufficient information about the encoding used in the storage data 212 in order to enable the recovery of the erasure storage data 224, erasure check data 228, or the combination thereof.

It has been discovered that the computing system 100 with erasure code mechanism including the data recovery process 301 can provide erasure recovery of three or more erasures. The erasure storage data 224, erasure check data 228, or combination thereof, can be recovered by the computing system 100 with erasure code mechanism including the data recovery process 301.

Figure 4:
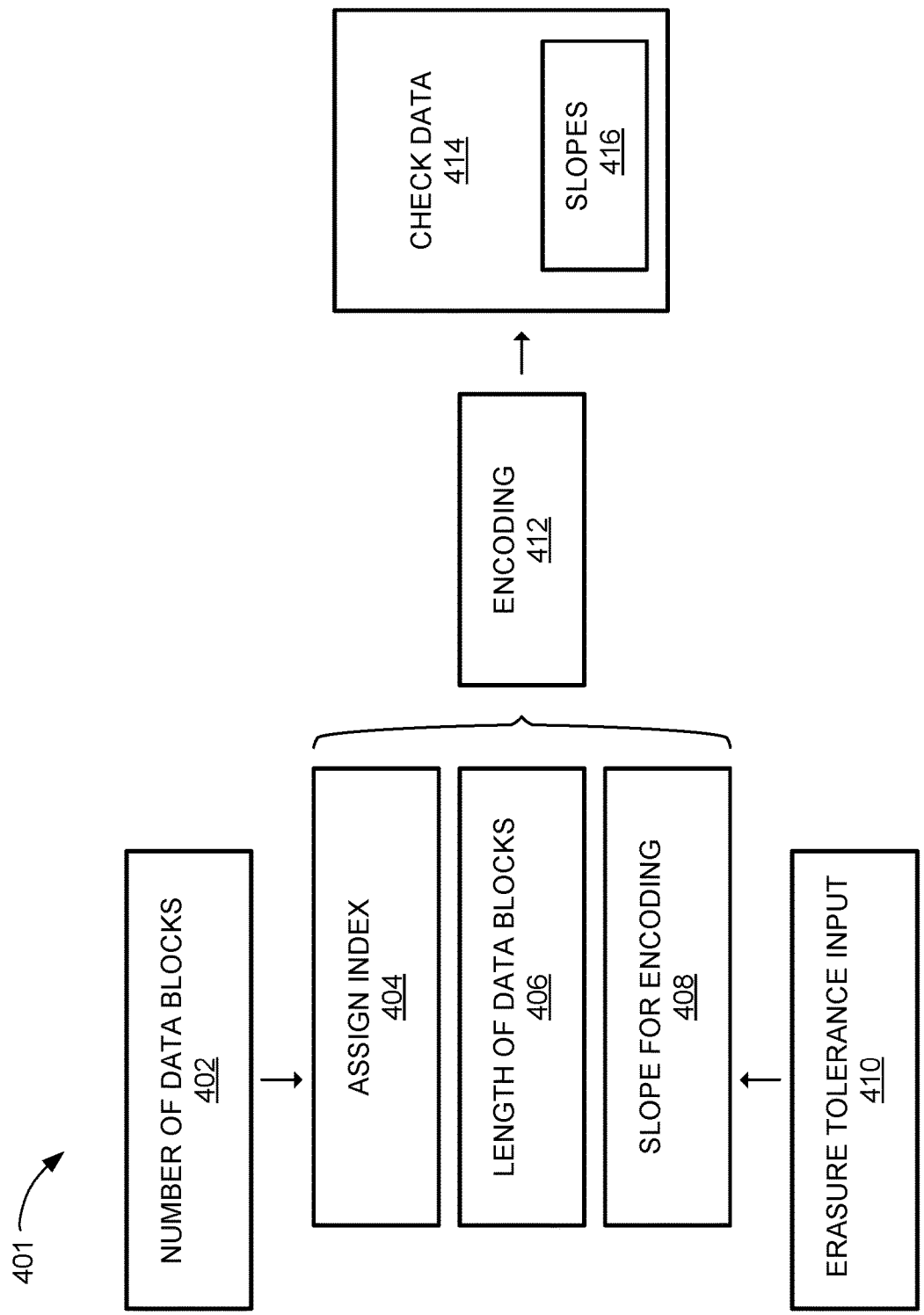
FIG. 4 is a functional block diagram of a shift encoding process of the computing system in an embodiment.

Referring now to FIG. 4, therein is shown a functional block diagram of a shift encoding process 401 of the computing system 100 in an embodiment. The functional block diagram of the shift encoding process 401 can provide encoding and decoding of the shift decoder 334 of FIG. 3 of the erasure coding decoder 328 of FIG. 3 to provide recovery of erased or missing information or data such as the erasure storage data 224 of FIG. 2, the erasure check data 228 of FIG. 2, or combination thereof.

The shift encoding process 401 can be implemented in hardware including electronic circuitry, transistors, integrated circuits, an integrated circuit core, a processor, electronic passive devices, or combination thereof. The shift encoding process 401 can also be implemented with the hardware operating software, machine code, firmware, embedded code, application software, or combination thereof.

The shift encoding process 401 can include an input buffer 402, an index generator 404, a length counter 406, a slope generator 408, a tolerance target input 410, an encoder 412, check data 414 such as a parity blocks, or combination thereof. The input buffer 402, the index generator 404, the length counter 406, the slope generator 408, the tolerance target input 410, the encoder 412, or combination thereof, can implemented in hardware including electronic circuitry, transistors, integrated circuits, an integrated circuit core, a processor, electronic passive devices, or combination thereof, or can be implemented with the hardware operating software, machine code, firmware, embedded code, application software, or combination thereof.

The input buffer 402 can be a hardware array of registers, memory configured array, a matrix math array, or a combination thereof. The input buffer 402 can hold a number of data blocks for encoding. The number of data blocks can be provided to the index generator 404 for assigning indices based on the number of data blocks. The indices can be used during the data recovery process 301 of FIG. 1 in order to limit the recovery to specific ones of the data blocks that represent the erasure storage data 224, the erasure check data 228, or combination thereof. Erasures, missing blocks, or erased blocks, such as the data errors 310 of the hard disk drives 134 of FIG. 3, the erasure storage data 224, the erasure check data 228, or combination thereof, can be indexed for recovery. Also, the tolerance target input 410 can establish a level of erasure tolerance for the shift encoding process 401.

The tolerance target input 410 can be provided to the slope generator 408 for calculating slopes 416 for encoding based on the level of erasure tolerance. The tolerance target input 410 can also determine the number of the blocks of check data 414 that must be generated in order to satisfy the desired erasure tolerance of the shift encoding process 401. The slope generator 408 can provide a different slope for each of the blocks of check data 414.

The encoder 412 can receive the input from the index generator 404, the length counter 406, and the slope generator 408 for processing the data held in the input buffer 402. Each of the slopes provided by the slope generator 408 will result in a separate one of the blocks of check data 414. It is understood that as the tolerance target input 410 increases, so does the number of the blocks of check data 414. Each of the blocks of check data 414 will have a different slope and a different length.

The input buffer 402 can be configured to provide a data sequence corresponding to the slopes 416 from the slope generator 408. The encoder 412 can access the input buffer 402 based on the input from the index generator 404, the length counter 406, and the slope generator 408 in order to provide the blocks of check data 414, which can include parity blocks with corresponding encoding slopes. The input buffer 402 can be configured to multiple inputs to the encoder 412, with each input representing one of the slopes 416 provided by the slope generator 408.

The blocks of check data 414, such as the check data 216 of FIG. 2, can include the slopes 416 such as data sequences, parity data sequences, or combination thereof, with different lengths longer or equal to lengths of data blocks such as the storage data 212 of FIG. 2. The slopes 416 can be indexed with a valid range of indices. Data or bits outside of the valid range can be set to be zero such as an imaginary padding zero. Each of the slopes 416 can be associated with a different cross-section of the input buffer 402 representing an exclusive OR of the data identified by the slopes 416 and presented to the encoder 412.

By way of an example, the encoder 412 can be configured to allow recovery of two erasures. The input buffer 402 can hold K data blocks $\{X_0, X_1, \ldots, X_{K-1}\}$, the encoder 412 can generate two of the blocks of check data 414 representing an exclusive or (XOR) of the data on the slopes 416 within the input buffer 402 as the parities $P_0$, $P_1$, to recover two erasures with encoding as follows:

$$P_0 = X_0 \oplus X_1 \oplus \ldots \oplus X_{K-1} \qquad \text{(Equation 1)}$$

$$P_1 = X_0 \oplus X_1^1 \oplus \ldots \oplus X_{K-1}^{K-1} \qquad \text{(Equation 2)}$$

A single erasure pattern can be based on only one data block $X_a$ that is lost. At least one of the blocks of check data 414 representing at least one of the parity blocks should be available, or the system will fail. Assume one of the blocks of check data 414, such as $P_k$ is available. We first take an "exclusive or" (XOR) of the parity block Pi with the persistent storage data 222 of FIG. 2 which represents the data blocks that were correctly retrieved, to construct one recovery equation.

$$X_a^{ka} = P_k \oplus_{i \neq a, b} X_i^{ki} \qquad \text{(Equation 3)}$$

For k=0, equation 3 becomes $X_a = P_k \oplus_{i \neq a, b} X_i$, then $X_a$ is successfully recovered. For k=1, the equation 3 gives $X_a^a$, a shifted version of $X_a$. The next step is to shift the resulting sequence to the left by a symbols to recover $X_a$.

A double erasure pattern can be based on $X_a$ and $X_b$ are erased (a<b). In this case, both $P_0$ and $P_1$ must be available, or the system will fail. The recursive decoding procedure will first recover $X_b$, and then use the information of $X_b$ to recover $X_a$. This procedure can be summarized as follows:

1. Construct two recovery equations $$X_a \oplus X_b = P_0 \oplus_{i \neq a, b} X_i = Y_0 \qquad \text{(Equation 4)}$$

$$X_a^a \oplus X_b^b = P_1 \oplus_{i \neq a, b} X_i^i = Y_1 \qquad \text{(Equation 5)}$$

2. Cancel out $X_a$ $$X_b \oplus X_b^{b-a} = Y_0 \oplus Y_1^{-a} = S_0 \qquad \text{(Equation 6)}$$

3. Solve for $X_b$ $$X_b = X_b^{b-a} \oplus S_0 \qquad \text{(Equation 7)}$$

4. Solve for $X_a$ $$X_a = Y_0 \oplus X_b \qquad \text{(Equation 8)}$$

For $X_i$ and $P_0$, the indices are from 0 to L-1, while $P_1$, the index is from 0 to K+L-2. The first step in decoding is as follows:

$$Y_0[m] = P_0[m] \oplus_{i \neq a, b} X_i[M] \qquad \text{(Equation 9)}$$

$$Y_1[m] = P_1[m] \oplus_{i \neq a, b} X_i[m-i] \qquad \text{(Equation 10)}$$

So $Y_0$ and $Y_1$ have the same length as $P_0$ and $P_1$, respectively.

In the second step, the length of $S_0$ is L. To find each symbol of $S_0$, for m=0, 1, ..., L-1

$$S_0[m] = Y_0[m] + Y_1[m+a] \qquad \text{(Equation 11)}$$

To find $X_b$, given $X_b[m]=0$ for $m \notin [0, L-1]$, and for m=0, 1, ..., L-1, $$X_b[m] = S_0[m] \oplus X_b[m-b+a] \qquad \text{(Equation 12)}$$

Then $X_a$ can be found by $$X_a[m] = X_b[m] \oplus Y_0[m] \qquad \text{(Equation 13)}$$

The above procedure can implement a recursive recovery.

The process 401 can also implement parallel decoding, which means $X_a$ and $X_b$ are found independently. The recovery of $X_b$ again follows equations 4, 5, 6, and 7. To recover $X_a$, first find the following:

$$S_1 = Y_0^{b-1} \oplus Y_1^{-a} = X_a \oplus X_a^{b-a} \qquad \text{(Equation 14)}$$

Which means for m=0, ..., L-1, $$S_1[m] = Y_0[m-b+a] \oplus Y_1[m+a] \qquad \text{(Equation 15)}$$

$$X_a[m] = S_1[m] \oplus X_a[m-b+a] \qquad \text{(Equation 16)}$$

The shift encoding process 401 can further recover triple erasures. For K data blocks $\{X_0, X_1, \ldots, X_{K-1}\}$, add three parities $P_0$, $P_1$, $P_2$, to recover any three erasures with encoding as follows:

$$P_0 = X_0 \oplus X_1 \oplus \ldots \oplus X_{K-1} \qquad \text{(Equation 17)}$$

$$P_1 = X_0 \oplus X_1^1 \oplus \ldots \oplus X_{K-1}^{K-1} \qquad \text{(Equation 18)}$$

$$P_2 = X_0 \oplus X_1^2 \oplus \ldots \oplus X_{K-1}^{2(K-1)} \qquad \text{(Equation 19)}$$

Therefore $P_0$ has length L, $P_1$, is L+K-1, and $P_2$ is L+2(K-1). The code of the shift encoding process 401 can be designed to recover any three or less than three erasures. For the three erasure case, the erasure patterns can be among at least three categories: 1) 1 of the erasure storage data 224, such as a single data block erasure+2 of the erasure check data 228, such as two of the parity block erasures (1D2P); 2) 2 of the erasure storage data 224+1 erasure check data 228 (2D1P); 3) 3 of the erasure storage data 224 (3D).

The shift encoding process 401 can be used to recover one data erasure and two parity erasures, based on only one of the erasure storage data 224, such as the data block $X_a$ that is lost. At least one parity block should be available, or the shift encoding process 401 can fail. It is understood that the tolerance target input 410 is equal to 3, which must provide 3 of the blocks of check data 414 each having a different one of the slopes 416. Based on the persistent check data 226 of FIG. 2, such as parity block $P_k$ being available, an XOR of the parity block $P_i$ and the persistent storage data 222 of FIG. 2, such as the available data blocks can include one recovery equation can be constructed as follows:

$$Y_0 = P_k \oplus_{i \neq a, b} X_i^{ki} = X_a^{ka} \qquad \text{(Equation 20)}$$

$P_1$ can be shifted to the left by ka symbols to obtain $X_a$, where the value of ka is indicated by the slope 416 provided with the persistent check data 226.

Assuming for $m \notin [0, \ldots, L_1]$, $X_i[m]=0$, $Y_0$ can be calculated as follows:

$$Y_0[m] = P_k[m] \oplus_{i \neq a, b} X_i[m-ki] \qquad \text{(Equation 21)}$$

If $Y_0$ has the same length as $P_k$, then for m=0, ..., L-1

$$X_a[m] = Y_0[m+ka] \qquad \text{(Equation 22)}$$

The shift encoding process 401 can be used to recover two data erasures and one parity erasure, based on $X_a$ and $X_b$ are the erasure storage data 224 erased, b>a, and the remaining parity blocks as the persistent check data 226 are Pk0 and Pk1, with slopes k0<k1, syndromes or recovery equations can be obtained as follows:

$$Y_0 = P_{k0} \oplus_{i \neq a, b} X_i^{k0i} \qquad \text{(Equation 23)}$$

$$Y_1 = P_{k1} \oplus_{i \neq a, b} X_i^{k1i} \qquad \text{(Equation 24)}$$

$X_a$ can be cancelled out by:

$$S_0 = Y_0^{-k0b} \oplus Y_1^{-k0(b-a)-k1a} = X_b \oplus X_b^{(k1-k0)(b-a)} \qquad \text{(Equation 25)}$$

$X_b$ can be recovered by:

$$X_b = S_0 \oplus X_b^{(k1-k0)(b-a)} \qquad \text{(Equation 26)}$$

The shift encoding process 401 can be used to find syndromes as follows:

$$Y_0[m] = P_0[m] \oplus_{i \neq a,b} X_i[m-k_0 i] \quad \text{(Equation 27)}$$

$$Y_1[m] = P_1[m] \oplus_{i \neq a,b} X_i[m-k_1 i] \quad \text{(Equation 28)}$$

$X_b$ can be found by calculating $\text{shift}_1 = k_0 b$, $\text{shift}_2 = k_0(b-a) + k_1 a$, $\text{shift}_3 = -(k_1 - k_0)(b-a)$, then for $m = 0, \ldots, L-1$ $$X_b[m] = Y_0[m+\text{shift}_1] \oplus Y_0[m+\text{shift}_2] \oplus X_b[m+\text{shift}_3] \quad \text{(Equation 29)}$$

Note that the indices of $Y_0$ are from 0 to $L+k_0(K-1)-1$, so $Y_0[m+\text{shift}_1]$ always has a valid index. Similarly, the indices of $Y_1$ are from 0 to $L+k_1(K-1)-1$, and $\text{shift}_2 = k_0(b-a) + k_1 a < k_1(b-a) + k_1 a = k_1 b \leq k_1(K-1)$, so $Y_1[m+\text{shift}_2]$ also has a valid index. For $X_b[m+\text{shift}_3]$, the bytes with indices $m+\text{shift}_3 < 0$ are set to be 0.

$X_a$ can be recovered after obtaining $X_b$. It reduces to the 1D2P problem. This scheduling can be referred to "recursive recovery." The delay caused by the recursive recovery can be avoided by recovering $X_a$ and $X_b$ simultaneously, as follows:

Cancel out $X_b$ $$S_1 = Y_0^{-k_0 b + k_1(B-a)} \oplus Y_1^{-k_1 a} = X_a \oplus X_a^{(k_1-k_0)(b-a)} \quad \text{(Equation 30)}$$

which means for $m = 0, \ldots, L-1$, $$S_1[m] = Y_0[m+k_0 b - k_1(b-a)] \oplus Y_1[m+k_1 a] \quad \text{(Equation 31)}$$

$$X_a[m] = S_1[m] \oplus X_a[m-(k_1-k_0)(b-a)] \quad \text{(Equation 32)}$$

The shift encoding process 401 can be used to recover three data erasures, based on $X_a$, $X_b$, and $X_c$ are the erased blocks with $c > b > a$. The syndromes can be calculated by:

$$Y_0 = P_0 \oplus_{i \neq a,b} X_i \quad \text{(Equation 33)}$$

$$Y_1 = P_1 \oplus_{i \neq a,b} X_i^i \quad \text{(Equation 34)}$$

$$Y_2 = P_2 \oplus_{i \neq a,b} X_i^{2i} \quad \text{(Equation 35)}$$

$X_a$ and $X_b$ can be cancelled out, and $X_c$ can be recovered from:

$$Y_0 \oplus Y_1^{-b} \oplus Y_1^{-a} Y_2^{-(b-a)-2a} = X_c \oplus X_c^{-b} \oplus X_c^{-a} \oplus X_c^{2c-a-b} \quad \text{(Equation 36)}$$

The shift encoding process 401 can be used to recover four erasures. For a problem: K data blocks, which can be denoted as $\{X_0, X_1, \ldots, X_{K-1}\}$, four parities can be added to recover any four erasures with encoding as follows:

The slope for encoding is 0, 1, 2, 3.

$$P_0 = X_0 \oplus X_1 \oplus \ldots \oplus X_{K-1} \quad \text{(Equation 37)}$$

$$P_1 = X_0 \oplus X_1^1 \oplus \ldots \oplus X_{K-1}^{K-1} \quad \text{(Equation 38)}$$

$$P_2 = X_0 \oplus X_1^2 \oplus \ldots \oplus X_{K-1}^{2(K-1)} \quad \text{(Equation 39)}$$

$$P_3 = X_0 \oplus X_1^3 \oplus \ldots \oplus X_{K-1}^{3(K-1)} \quad \text{(Equation 40)}$$

The length of each parity block can be as follows:

TABLE 1

|  | $P_0$ | $P_1$ | $P_2$ | $P_3$ |
| --- | --- | --- | --- | --- |
| length | L | L + K − 1 | L + 2(K − 1) | L + 3(K − 1) |

The length of the parity block, which is encoded using slope $k_n$, is given by $L+k_0(K-1)$.

For illustrative purposes, recovery of up to four erasures is described, although it is understood that any number of erasures can be recovered based on the tolerance target input 410. The computing system 100 can extend recovery to any dimension by choosing slopes to encode and solve for an inverse matrix of different erasure patterns.

By way of an example, the erasure coding process 412 can recover any four erasures. For example, a four erasure pattern can include three data erasure and one parity erasures (3D1P). At least some other four erasure recovery can be a special event of the erasure coding process 412.

The erasure coding process 412 can include data blocks such as the solid state disk 116 of FIG. 1, the non-volatile memory 118 of FIG. 1, the memory device 130 of FIG. 1, the hard disk drives 134 of FIG. 1, the network attached storage device 154 of FIG. 1, the array of storage devices 136 of FIG. 3, the hard disk drives 134 of FIG. 3, any memory, any storage, or combination thereof. The data blocks can be represented by vertical lines in the example graph.

By way of an example, data block $X_0$ 240 has not been erased, while data block $X_a$ 242, data block $X_b$ 244, and data block $X_{n-1}$ 246 each have been erased. The persistent parity blocks have slopes 416 of FIG. 4 have slopes $k_0$, $k_1$, and $k_2$ with $k_0 < k_1 < k_2$. The first parity block 248 can have the slope of $k_0$. The second parity block can have the slope $k_1$ and a shifted parity line. An $N^{th}$ parity block can have the slope of $k_2$ and a second shifted parity line. An $N+1^{st}$ parity block 250 can have the slope of $k_3$ and a third shifted line. Following are corresponding algebraic representations.

For example, $X_a$ and $X_b$ and $X_c$ are erased and $c > b > a$. Remaining parity blocks have slopes $k_0$, $k_1$, and $k_2$ with $k_0 < k_1 < k_2$. Syndromes can be given by:

$$Y_0 = P_{k_0} \oplus_{i \neq a,b} X_i^{k_0 i} \quad \text{(Equation 63)}$$

$$Y_1 = P_{k_1} \oplus_{i \neq a,b} X_i^{k_1 i} \quad \text{(Equation 64)}$$

$$Y_2 = P_{k_2} \oplus_{i \neq a,b} X_i^{k_2 i} \quad \text{(Equation 65)}$$

Multiple lines, such as six, can be used to cancel out $X_a$ and $X_b$:

$$Y_0^{-k_0 c} \oplus Y_0^{(k_2-k_1)(b-a)-k_0 c} \oplus Y_1^{-k_0(c-b)-k_1 b} \oplus \\ Y_1^{k_2(b-a)-k_0(c-a)-k_0(c-a)-k_1 b} \oplus Y_2^{-k_0(c-a)-k_2 a} \oplus \\ Y_2^{-k_0(c-b)-k_1(b-a)-k_2 a} = X_c \oplus X_c^{(k_1-k_0)(c-b)} \oplus \\ X_c^{(k_2-k_0)(c-a)} \oplus X_c^{(k_2-k_1)(b-a)} \oplus \\ X_c^{k_2(c-a)-k_1(b-a)-k_0(c-b)} \oplus X_c^{k_2(b-a)-k_1(c-b)-k_0(c-a)} \quad \text{(Equation 66)}$$

Syndromes can be implemented in a manner similar to the two data erasures and two parity erasures. For $X_c$, the shifts can be calculated as follows:

TABLE 4

| | shift$_Y$ value | | shift$_Y$ value |
| --- | --- | --- | --- |
| 1 | $k_0 c$ | 1 | $-(k_1 - k_0)(c - b)$ |
| 2 | $k_0 c - (k_2 - k_1)(b - a)$ | 2 | $-(k_2 - k_0)(c - a)$ |
| 3 | $k_0(c - b) + k_1 b$ | 3 | $-(k_2 - k_1)(b - a)$ |
| 4 | $k_0(c - a) + k_1 b - k_2(b - a)$ | 4 | $-k_2(c - a) - k_1(b - a) + k_0(c - b)$ |
| 5 | $k_0(c - a) + k_2 a$ | 5 | $-k_2(b - a) - k_1(c - b) + k_0(c - a)$ |
| 6 | $k_0(c - b) + k_1(b - a) + k_2 a$ | | |

Then for $m = 0-, \ldots, L-1$:

$$X_c[m] = Y_0[m+\text{shift}_Y(1)] \oplus Y_0[m+\text{shift}_Y(2)] \oplus Y_1[m+\text{shift}_Y(3)] \oplus Y_1[m+\text{shift}_Y(4)] \oplus Y_2[m+\text{shift}_Y(5)] \oplus Y_2[m+\text{shift}_Y(6)] \oplus X_c[m+\text{shift}_X(1)] \oplus X_c[m+\text{shift}_X(2)] \oplus X_c[m+\text{shift}_X(3)] \oplus X_c[m+\text{shift}_X(4)] \oplus X_c[m+\text{shift}_X(5)] \quad \text{(Equation 68)}$$

Note that a valid index of syndromes is in the range of all the indices that are not inside these regions and will be interpreted as a zero padding:

TABLE 5

| syndrome | start | end |
|---|---|---|
| $Y_0$ | 0 | $L + k_0(K - 1) - 1$ |
| $Y_1$ | 0 | $L + k_1(K - 1) - 1$ |
| $Y_2$ | 0 | $L + k_2(K - 1) - 1$ |

In a special case, the slopes satisfy $2k_1 = k_2 + k_0$.

$$Y_0^{-k_0c} \oplus Y_1^{-k_0(c-b)-k_1b} \oplus Y_1^{-k_0(c-a)-k_1a} \oplus$$
$$Y_2^{-k_0(c-b)-k_1(b-a)-k_2a} = X_c \oplus X_c^{(k_1-k_0)(c-b)} \oplus$$
$$X_c^{(k_1-k_0)(c-a)} \oplus X_c^{k_2(c-a)-k_1(b-a)-k_0(c-b)} \quad \text{(Equation 69)}$$

The erasure coding process 1300 can also provide erasure recovery for four data erasures (4D). Given $X_a$, $X_b$, $X_c$, and $X_d$ are erased, with $d>c>b>a$. Based on slopes $k_0$, $k_1$, $k_2$, and $k_3$ in an arithmetic sequence, the following result is true:

$$Y_0^{-k_0d} \oplus Y_1^{-k_1c-k_0(d-c)} \oplus Y_1^{-k_1b-k_0(d-b)} \oplus Y_1^{-k_1a-k_0(d-a)}$$
$$\oplus Y_2^{-k_2b-k_1(c-b)-k_0(d-b)} \oplus Y_2^{-k_2a-k_1(b-a)-k_0(d-b)}$$
$$\oplus Y_2^{-k_2a-k_1(c-a)-k_0(d-c)}$$
$$\oplus Y_3^{-k_3a-k_2(b-a)-k_1(c-b)-k_0(d-c)} = X_d \oplus X_d^{(k_1-k_0)(d-c)}$$
$$\oplus X_d^{(k_1-k_0)(d-b)} \oplus X_d^{(k_1-k_0)(d-a)}$$
$$\oplus X_d^{k_2(d-b)-k_1(c-b)-k_0(d-b)} \oplus X_d^{k_2(d-a)-k_1(b-a)-k_0(d-b)}$$
$$\oplus X_d^{k_2(d-a)-k_1(c-a)-k_0(d-c)}$$
$$\oplus X_d^{k_3(d-a)-k_2(b-a)-k_1(c-b)-k_0(d-c)} \quad \text{(Equation 70)}$$

The computing system 100 can also provide erasure coding and erasure recovery for negative slopes. For example, the following is based on four erasures with parity block slopes −1, 0, 1, and 2:

$$P_{-1} = X_0 \oplus X_1^{-1} \oplus \ldots \oplus X_{K-1}^{-(K-1)} \quad \text{(Equation 71)}$$

$$P_0 = X_0 \oplus X_1 \oplus \ldots \oplus X_{K-1} \quad \text{(Equation 72)}$$

$$P_1 = X_0 \oplus X_1^1 \oplus \ldots \oplus X_{K-1}^{K-1} \quad \text{(Equation 73)}$$

$$P_2 = X_0 \oplus X_1^1 \oplus \ldots \oplus X_{K-1}^{2(K-1)} \quad \text{(Equation 74)}$$

The computing system 100 can include a parity sequence that is longer than a data sequence. The computing system 100 can provide indexing such that in a parity sequence of a parity block, a bit that passes $X_0[0]$ has an index zero (0).

For parity blocks with positive slopes, a valid index is in a range: 0 to $L+k(K-1)-1$, where k is the positive slope. For parity blocks with negative slopes, a valid index is in a range: $-|k|(K-1)-1$ to $L-1$, where k is the negative slope. Therefore, compared to positive slope cases, a negative slope parity block includes an index offset of: $-|k|(K-1)$. The computing system 100 includes coding equations for positive slopes that are valid for negative slopes, given that if an index of one bit is not a valid index, the index is set to zero (0).

It has been discovered that the shift encoding process 401 can be easily generalized to any number of data blocks and any erasure tolerance ability or level. The shift encoding process 401 can index any number of the data blocks, provide encoding slopes for any erasure tolerance, or combination thereof, to provide the slopes 416 for the persistent check data 226, such as check blocks, with associated encoding slopes.

Figure 5:
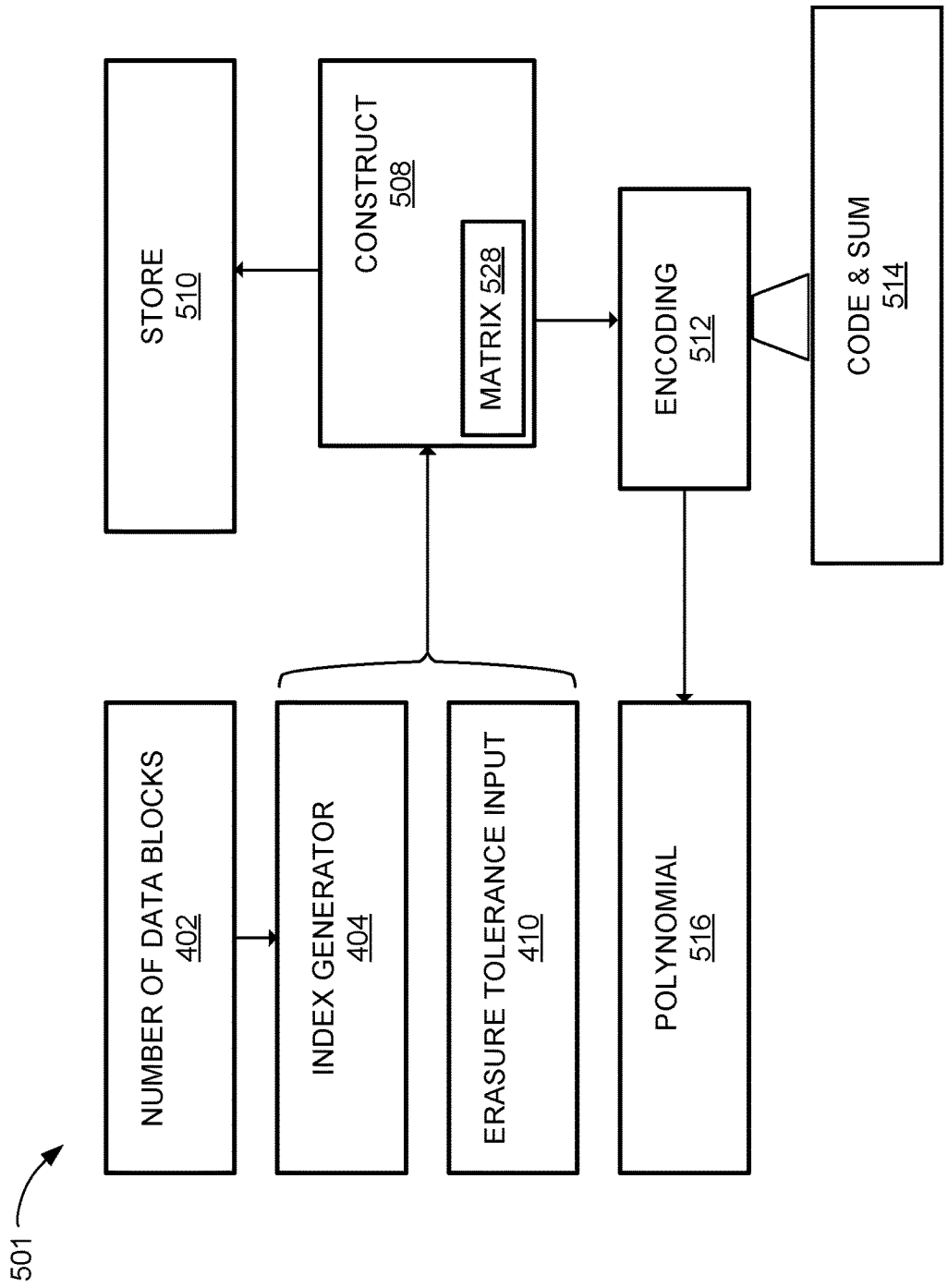
FIG. 5 is a functional block diagram of a polynomial encoding process of the computing system in an embodiment of the invention.

Referring now to FIG. 5, therein is shown a functional block diagram of a polynomial encoding process 501 of the computing system 100 in an embodiment of the invention. The polynomial encoding process 501 can provide recovery of erasures with improved redundancy in a manner similar to the shift encoding process 401 of FIG. 4. The polynomial encoding process 501 can include a generalization of the shift encoding process 401 that can be implemented with sequential logic, requires less redundancy, or combination thereof, to provide recovery of erased or missing information or data such as any data including parity or check information or data.

The polynomial encoding process 501 can be implemented in hardware including electronic circuitry, transistors, integrated circuits, an integrated circuit core, a processor, electronic passive devices, or combination thereof. The polynomial encoding process 501 can also be implemented with the hardware operating software, machine code, firmware, embedded code, application software, or combination thereof.

The polynomial encoding process 501 can include the input buffer 402, the index generator 404, the tolerance target input 410, a construct generator 508, a storage register 510, an encoder 512, a code and sum register 514, a polynomial storage 516, or combination thereof. The input buffer 402, the index generator 404, the tolerance target input 410, the construct generator 508, the storage register 510, the encoder 512, the code and sum register 514, the polynomial storage 516, or combination thereof, can implemented in hardware including electronic circuitry, transistors, integrated circuits, an integrated circuit core, a processor, electronic passive devices, or combination thereof, or can be implemented with the hardware operating software, machine code, firmware, embedded code, application software, or combination thereof. The storage register 510 can be a hardware register, a volatile memory, a non-volatile memory, or a combination thereof accessed by the construct generator 508 for holding intermediate results. The polynomial storage 516 can be coupled to the encoder 512 for storing the polynomial used to encode the check data 216 of the storage data 212. The polynomial storage 516 can include hardware registers, non-volatile memory, or a combination thereof. It is understood that the polynomial storage 516 can be a path to a metadata storage coupled to the data storage system 104.

For example, the polynomial encoding process 501 can encode, decode, or combination thereof, with sequential logic including a shift register. The components of the polynomial encoding process 501 can be implemented in hardware including electronic circuitry, transistors, integrated circuits, an integrated circuit core, a processor, electronic passive devices, or combination thereof.

The input buffer 402 can store a number of data blocks, identify a count of the data blocks, and provide the data blocks to the construct generator 508 for use by the encoder 512. The number of data blocks can be provided through the index generator 404. The index generator 404 can receive the number of the data blocks for providing an index reference for each of the data blocks. The data errors 310 of FIG. 3 of the hard disk drives 134 of FIG. 1, can be identified by the index for recovery of the erasure storage data 224 of FIG. 2, the erasure check data 228 of FIG. 2, or combination thereof. The tolerance target input 410 can establish an erasure tolerance including an ability level, a level, a factor, a value, a variable, or combination thereof including determining how many of the check disks 206 of FIG. 2 are required for the check data 216 of FIG. 2.

The index generator 404 and the tolerance target input 410 can be coupled to the construct generator 508. The construct generator 508 can receive the index for each of the data blocks, the erasure tolerance input, and the data blocks from the input buffer 402, for constructing a matrix 528, can be a Cauchy matrix. The matrix 528 of the construct generator 508 can be loaded into the storage register 510 for subsequent use of the matrix 528.

The encoder 512 can access the matrix 528 within the construct generator 508, for encoding or decoding, the check data 216 and corresponding polynomials, such as encoding polynomials. For example, the encoder 512 can provide coding with a calculation, for example calculating an inverse of a submatrix of the Cauchy matrix, calculating a Gaussian elimination algorithm, other like calculations, or combination thereof.

The encoder 512 can also be coupled to a code and sum register 514. The code and sum register 514 can include a convolution code or a block code for each of the data blocks that can be summed up to provide the parity blocks, the corresponding polynomials, or combination thereof.

The parity blocks can be included in the check data 216, the check data 414, the slopes 416, or combination thereof. The encoder 512 can load the polynomials used to encode the check data 216 into the polynomial storage 516 for use during data recovery.

The polynomial encoding process 501 can include aspects of the shift encoding process 401 with each block of the check data 216 shifted by different amounts and added up in a binary fashion such as an "exclusive or" (XOR) operation. The result provides varying length for each of the blocks of the check data 216, such as a longer sequence, can be stored in a parity block.

By way of an example, K can represent a number of blocks of the storage data 212, L can represent the number of bytes in each block of the storage data 212, a parity block of the check data 216 with index n can store $L+k_n(K-1)$ bytes, where $k_n$ can represent a constant such as the slope 416 of FIG. 4. In order to correct three erasures, the check data 216 will include three parity blocks having byte lengths of L, L+K−1, and L+2(K−1), respectively.

In the polynomial encoding process 501 the storage data 212 can be represented by a series of polynomials:

$$X[z] = x_{L-1}z^{L-1} + x_{L-2}z^{L-2} + \ldots + x_0 \quad \text{(Equation 41)}$$

Where the coefficients x's are the data in bytes, and z represents the delay unit, $z^i$ denotes i time slots. Shifting the sequence to the right by a time slots is equivalent to multiplying X[z] by $z^a$. Therefore an example having 3 data blocks in the storage data 212 and 3 parity blocks in the check data 216 can be represented by the following equation:

$$\begin{bmatrix} P_0(z) \\ P_1(z) \\ P_2(z) \end{bmatrix} = \begin{bmatrix} 1 & 1 & \ldots & 1 \\ 1 & z^1 & \ldots & z^{K-1} \\ 1 & z^2 & \ldots & z^{2(K-1)} \end{bmatrix} \cdot \begin{bmatrix} X_0(z) \\ X_1(z) \\ \vdots \\ X_{K-1}(z) \end{bmatrix} \quad \text{(Equation 42)}$$

where $X_i[z]$'s are the blocks of the storage data 212 represented as polynomials, $P_i[z]$'s are the resulting blocks of the check data 216 in the polynomial form. A generator matrix can establish the required shift amounts of the blocks of the storage data 212 in order to generate each parity block of the check data 216, respectively. The largest exponent of $z^i$ on each row determines the storage redundancy of the corresponding parity block.

In another embodiment, the polynomial encoding process 501 can include aspects of the shift encoding process 401 viewed as a group of polynomial equations. Each data block $X_i$ can be viewed as a polynomial X(z), where z can be treated as a delay unit as follows:

$$X_i(z) = X_i[L-1]z^{L-1} + X_i[L-2]z^{L-2} + \ldots + X_i[1]z + X_i[0] \quad \text{(Equation 43)}$$

Erasure recovery can be equivalent to solving an equation system. By way of an example, $X_a(z)$, $X_b(z)$, and $X_c(z)$ can be information blocks to recover. The polynomial encoding process 501 can find polynomials $X_a(z)$, $X_b(z)$ and $X_c(z)$ that satisfy the following:

$$\begin{bmatrix} 1 & 1 & 1 \\ z^a & z^b & z^c \\ z^{2a} & z^{2b} & z^{2c} \end{bmatrix} \cdot \begin{bmatrix} X_a(z) \\ X_b(z) \\ X_c(z) \end{bmatrix} = \begin{bmatrix} Y_0(z) \\ Y_1(z) \\ Y_2(z) \end{bmatrix} \quad \text{(Equation 44)}$$

where $Y_k(z)$ can be syndromes calculated by $P_k(z) \alpha \Sigma\Sigma_{i \neq a,b,c} z^{ki} X_i(z)$. Additions can be mod 2 operations, such as an exclusive OR.

In an embodiment, three (3) information blocks can be recovered by performing Gaussian elimination. For example, recovering $X_c(z)$ can include:

Removing $X_a$:

$$(z^a + z^b)X_b(z) + (z^a + z^c)X_c(z) = z^a Y_0(z) + Y_1(z) \quad \text{(Equation 45)}$$

$$(z^{a+b} + z^{2b})X_b(z) + (z^{c+a}z^{2c})X_c(z) = z^a Y_1(z) + Y_2(z) \quad \text{(Equation 46)}$$

Cancel out $X_b(z)$:

$$(z^{a+b} + z^{c+b} + z^{c+a}z^{2c})X_c(z) = z^{a+b}Y_0(z) + (z^b + z^a)Y_1(z) + Y_2(z) \quad \text{(Equation 47)}$$

Thus, the decoding process is equivalent to finding an inverse of the coefficients matrix, as follows:

$$\begin{bmatrix} f_{a0}(z) & f_{a1}(z) & f_{a2}(z) \\ f_{b0}(z) & f_{b1}(z) & f_{b2}(z) \\ f_{c0}(z) & f_{c1}(z) & f_{c2}(z) \end{bmatrix} \cdot \begin{bmatrix} 1 & 1 & 1 \\ z^a & z^b & z^c \\ z^{2a} & z^{2b} & z^{2c} \end{bmatrix} = \begin{bmatrix} 1 & 0 & 0 \\ 0 & 1 & 0 \\ 0 & 0 & 1 \end{bmatrix} \quad \text{(Equation 48)}$$

Based on the above, $X_a(z)$, $X_b(z)$, and $X_c(z)$ can be recovered by solving $$\begin{bmatrix} X_a(z) \\ X_b(z) \\ X_c(z) \end{bmatrix} = \begin{bmatrix} f_{a0}(z) & f_{a1}(z) & f_{a2}(z) \\ f_{b0}(z) & f_{b1}(z) & f_{b2}(z) \\ f_{c0}(z) & f_{c1}(z) & f_{c2}(z) \end{bmatrix} \cdot \begin{bmatrix} Y_0(z) \\ Y_1(z) \\ Y_2(z) \end{bmatrix}$$

The polynomial encoding process 501 can extend recovery to any planned dimension of recovery. For example, to recover five erasures, choose slopes for five blocks of the check data 216 to encode and solve for an inverse matrix of different erasure patterns.

Additional padding such as redundancy padding to ensure a start point in a recovery process in a manner similar to the shift encoding process 401 of FIG. 4, can be included with larger slopes. For example, given four erasure tolerance, extra padding can include sixty (60) symbols based on slopes 1, 0, 1, 2, with the number of data blocks K=16. The polynomial encoding process 501 can be improved to reduce the number for padding including padding zeros as follows:

By a way as an example, given K=7, for a double erasure, a generating matrix can be as follows:

$$G = \begin{bmatrix} 1 & 1 & 1 & 1 & 1 & 1 & 1 \\ 1 & z & 1+z & z^2 & 1+z^2 & z+z^2 & 1+z+z^2 \end{bmatrix}$$ (Equation 49)

Given $X = [X_0(z), \ldots, X_6(z)]^T$ as a vector of data block polynomials. Parity blocks $P = [P_0(z), P_1(z)]^T$ can be obtained by $P = G \cdot X$, where represents matrix multiplication, and the addition operation is implemented as the elementwise exclusive or operation.

The length of $P_0$ is L, while the length of $P_1$ is L+2. The additional or extra padding can be significantly smaller than other processes such as the shift encoding process 401.

By another example, based on the requirement that the length of $P_0$ is equal to $P_1$, another generator matrix $\overline{G}$ is as follows:

$$\overline{G} = \begin{bmatrix} 1 & 1 & 1+z & 1 & z & 1+z & 1 \\ 1 & 1+z & z & 1+z & 1 & 1 & 1 \end{bmatrix}$$ (Equation 50)

The length of both $P_0$ and $P_1$ is L+1,

Using $\overline{G}$ as the generator matrix. The polynomial decoding process 336 is illustrated as follows. Based on $X_1$ and $X_3$ erased, recovery equations can be as follows:

$zX_1(z) + X_3(z) = Y_0(z)$ (Equation 51)

$(1+z)X_1(z) + (1+z)X_3(z) = Y_1(z)$ (Equation 52)

where $Y_k(z)$ can be syndromes calculated by $P_k(z) + \Sigma_{i \neq 1,3} g_{(k+1),(i+1)}(z)X_i(z)$. $g_{(k+1),(i+1)}(z)$ can be the polynomial at the (k+1)-th row, (i+1)-th column of matrix $\overline{G}$.

$X_1(z)$ can be recovered as follows:

$S_0(z) = (1+z)Y_0(z) + Y_1(z) = (1+z^2)X_1(z)$ (Equation 53)

$X_1(z) = \frac{1}{1+z^2} S_0(z)$ (Equation 54)

A degree of each row, or row degree, of G can represent the largest degree of a polynomial on that row. The row degree can determine the extra redundancy for a parity block, thus G can be constructed to minimize the row degree. For recovery of two erasures, a generator matrix can provide that a submatrix of any two columns is non-singular, such that for any two columns $[g_{1,1}(z), g_{2,1}(z)]^T$, $[g_{1,2}(z), g_{2,2}(z)]^T$, can include as follows:

$g_{1,1}(z)g_{2,2}(z) - g_{2,1}(z)g_{1,2}(z) \neq 0$ (Equation 55)

Based on the above, a lemma can include: If $\gcd(g_{1,1}(z), g_{2,1}(z)) = \gcd(g_{1,2}, g_{2,2}) = 1$, and $g_{1,1}(z) \neq g_{1,2}(z)), g_{2,1}(z) \neq g_{2,2}(z)$, then $g_{1,1}(z)g_{2,2}(z) - g_{2,1}(z)g_{1,2}(z) \neq 0$. Further, a proof can include: by way of an example $g_{1,1}(z)g_{2,2}(z) - g_{2,1}(z)g_{1,2}(z) = 0$, then $g_{2,1}(z)|g_{2,2}(z)$, and $g_{2,2}(z)|g_{2,1}(z)$. Then $g_{2,1}(z) = g_{2,2}(z)$, which can contradict the condition. Therefore $g_{1,1}(z)g_{2,2}(z) - g_{2,1}(z)g_{1,2}(z) \neq 0$.

The polynomial encoding process 501 can include encoding of several data blocks. For the case of double erasure tolerance, by constructing G using lemma stated above, up to thirty-one data blocks can be encoded by choose coprime polynomial pairs as follows:

TABLE 2

| | Pair of polynomials. | | | | | | |
|---|---|---|---|---|---|---|---|
| | 1 | z | 1 + z | $z^2$ | 1 + $z^2$ | 1 + z + $z^2$ | z + $z^2$ |
| 1 | ○ | ○ | ○ | ○ | ○ | ○ | ○ |
| z | ○ | X | ○ | X | ○ | ○ | X |
| 1 + z | ○ | ○ | X | ○ | X | ○ | X |
| $z^2$ | ○ | X | ○ | X | ○ | ○ | X |
| 1 + $z^2$ | ○ | ○ | X | ○ | X | ○ | X |
| 1 + z + $z^2$ | ○ | ○ | ○ | ○ | ○ | X | ○ |
| z + $z^2$ | ○ | X | X | X | X | ○ | X |

○: coprime.
X: non-coprime

The improved polynomial encoding process 501 can extend to recover three erasures. The polynomial encoding process 501 can utilize the construct generator 508 for construction of the matrix 528. The matrix 528 includes rows with different maximum row degrees and no submatrix that is singular. For example, a finite field operation and polynomial ring operation can provide a singularity reserve. For M=3, a Vandermonde matrix G can be used in matrix 528. It is proved that every square submatrix of G is nonsingular, and without loss of generality, a generator matrix can be constructed as follows:

$$G = \begin{bmatrix} 1 & 1 & \ldots & 1 \\ 1 & \alpha^1 & \ldots & \alpha^{K-1} \\ 1 & \alpha^2 & \ldots & \alpha^{2(K-1)} \end{bmatrix}$$ (Equation 58)

A proof can be given to show that every square submatrix of G is nonsingular. It is well understood that any one by one (1×1) and three by three (3×3) submatrix of G is non-singular. For two by two (2×2) submatrices, three cases are included:

1) elements can be chosen from a first row and a second row of G;
2) elements can be chosen from second row and third row of G;
3) elements can be chosen from first row and second row, or combination thereof.

For 1) and 2), the submatrix is a Vandermonde matrix, thus can be non-singular. For 3), the submatrix can include as follows:

$$S = \begin{bmatrix} 1 & 1 \\ \alpha^{2i} & \alpha^{2j} \end{bmatrix}$$ (Equation 59)

where $0 \leq i < j \leq K-1$. Based on the above equation, det $S = \alpha^{2j} - \alpha^{2i}$. Therefore, det S=0 if and only if $2j \equiv 2i \mod 2^m-1$, or equivalently, $2^m-1 | 2(j-i)$. Since $2^m-1$ is an odd number, then it follows that $2^m-1 | j-i$, which cannot be possible based on the assumptions, therefore S is non-singular.

The improved polynomial encoding process 501 can extend to recover more than three erasures. a matrix such as a Cauchy matrix can be used in matrix 528 The following gives the descriptions on how to construct a Cauchy matrix. Assume F is a Galois field with two sets of elements including $\{x_1, \ldots, x_m\}$, $\{y_1, \ldots, y_n\}$, such that:

1. $\forall i \in \{1, \ldots, m\}, \forall j \in \{1, \ldots, n\}: x_i + y_j \neq 0$ Any pair of $x_i$ and $y_j$ are distinct 2. $\{x_1, \ldots, x_m\}$ are mutually distinct. $\{y_1, \ldots, y_n\}$ are mutually distinct.

The matrix 528, such as a Cauchy matrix over F, can be constructed to provide every square submatrix as nonsingular, as follows:

$$G = \begin{bmatrix} \frac{1}{x_1+y_1} & \frac{1}{x_1+y_2} & \cdots & \frac{1}{x_1+y_n} \\ \frac{1}{x_2+y_1} & \frac{1}{x_2+y_2} & \cdots & \frac{1}{x_2+y_n} \\ \vdots & \vdots & \ddots & \vdots \\ \frac{1}{x_m+y_1} & \frac{1}{x_m+y_2} & \cdots & \frac{1}{x_m+y_n} \end{bmatrix} \quad \text{(Equation 60)}$$

Given the above, matrix G, is an m×n matrix. It is understood that, for any k×k submatrix C of G, C is a Cauchy matrix. Any square submatrix of matrix G is nonsingular.

The polynomial encoding process 501 can include the matrix 528 such as a Cauchy matrix, configured as constructed by the construct 508 for erasure coding with M=4, K=16, and for K≤28, each of four parity blocks can include four extra byte padding.

For example, the matrix 528, such as a Cauchy matrix, can be constructed including M+K different elements from $GF(2^m)$ with a smallest m is five (5). A field can include $F_2[k]/(x^5+x^2+1)$. Given $x_i$, i=1, 2, 3, 4, can be an element with binary expansion of an integer i−1, with $y_i$ as a field element with a binary expansion of an integer 4+i−1. Inverse pairs of the elements can be (1,1), (2, 18), (3, 28), (4, 9), (5, 23), (6, 14), (7, 12), (8, 22), (10, 25), (11, 16), (13, 15), (17, 24), (19, 29), (20, 30), (21, 26), (27, 31).

For illustrative purposes recovery for up to four erasures are described, although it is understood that the computing system 100 can be scaled to provide any number of erasures can be recovered. The computing system 100 can extend recovery to any dimension by choosing slopes 416 of FIG. 4 to encode and solve for an inverse matrix of different erasure patterns.

For illustrative purposes, the polynomial encoding process 501 is shown with the construct generator 508 with the matrix 528 although it is understood that the polynomial encoding process 501 may provide polynomials with any process. The construct generator 508 can provide any construction, calculations, or combination thereof, for error or erasure recovery.

Further for illustrative purposes, recovery for up to four erasures are described, although it is understood that any number of erasures can be planned for recovery. The computing system 100 can extend recovery to any dimension by choosing the slopes 416 to encode and solve for an inverse matrix of different erasure patterns.

It has been discovered that the polynomial encoding process 501 with the construct generator 508 can be implemented with sequential logic and includes improved redundancy. The polynomial encoding process 501 with the construct generator 508 includes the matrix 528 for encoding, decoding, or combination thereof, for providing parity blocks, corresponding polynomials 516, such as encoding polynomials.

The polynomial encoding process 501 can include another construction of a matrix with square submatrices that are all non-singular. Firstly we construct is a m×(K+m) Vandermonde matrix. The first m columns is a m×m matrix A. The rest columns form a m×K matrix B. Then $A^{-1}B$ can include every square matrix as non-singular, and not Cauchy matrices. It can be used as a generator matrix.

Figure 6:
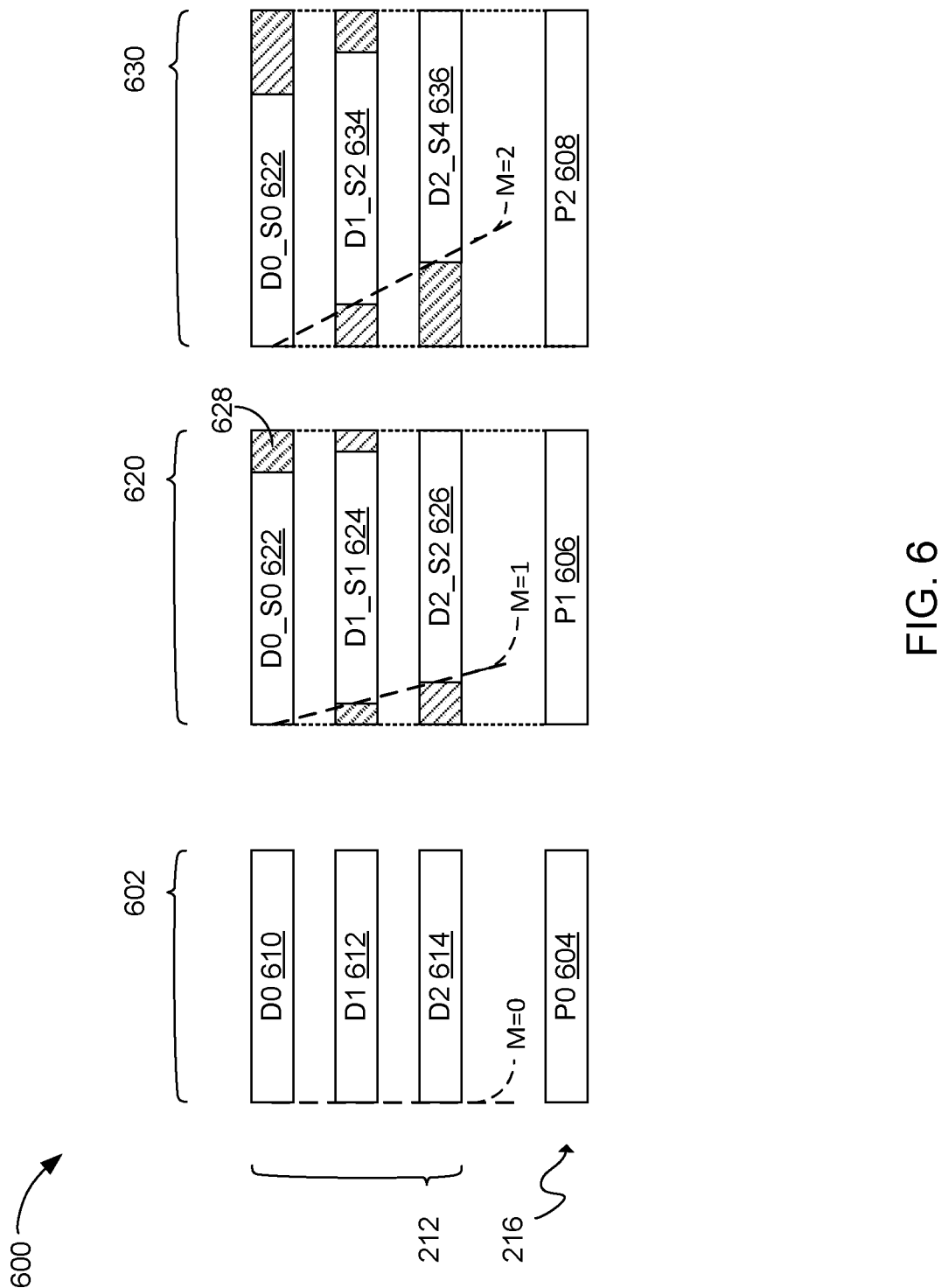
FIG. 6 is an example of a coding process of the computing system in an embodiment of the invention.

Referring now to FIG. 6, therein is shown an example of a coding process 601 (where is 601?) of the computing system 100 in an embodiment of the invention. The coding process 601 can include blocks such the storage data 212, the check data 216, or a combination thereof. The coding process 601 can provide recovery of erased or missing information or data such as any data including parity or check information or data. For this example the storage data 212 consists of three of the data blocks 602, which can be recovered with a maximum of three erasures.

The coding process 601 produce the check data 216 including a first parity block (P0) 604, a second parity block (P1) 606, and a third parity block (P2) 608. The data blocks 602 can include a first data block (D0) 610, a second data block (D1) 612, and a third data block (D2) 614.

The first parity block (P0) 604 can be generated by an exclusive OR (XOR) of the D0 610, the D1 612, and the D2 614 with no off-set, which is similar to a parity structure of a random array of independent disks (RAID 5). The no off-set state is said to have the slope 416 of FIG. 4 with M=0. It is understood that the first parity block 604 is not capable of correcting the desired erasure tolerance of recovering the three data blocks 602 with three erasures.

The second parity block (P1) 606 can apply a sequential shift of the data blocks 602. A shifted data sequence 620 can start with the D0 610 establishing a reference location, D1 612 shifted one byte to the right of D0 610, and D2 614 shifted one byte to the right of D1 612. This sequential shift can generate the slope 416 with M=1. The shifted data sequence 620 can have a first data shift zero 622, a second data shift one 624, a second data shift two 626, and a fill region 628, which can border each of the first data shift zero 622, the second data shift one 624, the second data shift two 626. The fill region 628 can be appended to the data blocks 602, at the front, at the end, or a combination thereof. The fill region 628 is composed of zero value data that can maintain the alignment of the data to the second parity block (P1) 606.

It is understood that the example provided generates the second parity block (P1) 606 that is two bytes longer that the first parity block (P0) 604. It is further understood that fill region 628 can provide an input the XOR of the data blocks 602 that does not alter the value of the data in the second parity block (P1) 606.

The third parity block (P2) 608 can apply a double sequential shift of the data blocks 602. A double shifted data sequence 630 can start with the first data shift zero 622 establishing a reference location. A second data shift two 634 can be shifted two bytes to the right of the first data shift zero 622. A third data shift four 636 can be shifted two bytes to the right of the second data shift two 634. The double shifted data sequence 630 can generate the slope 416 with M=2 and the fill region 628 having a length of four bytes. It is understood that additional parity blocks can be added to protect the storage data 212. As the number of the blocks in the check data 216 increases, the size of each of the parity blocks will also increase.

It is understood that the generation of the first parity block (P0) 604, the second parity block (P1) 606, and the third parity block (P2) 608 was described as applying an XOR function across the data blocks 602, but this is an example only and other combining methods can be used. It is understood that the first data block (D0) 610, the second data block (D1) 612, and the third data block (D2) 614 can be combined in other manners as well. By way of an example, the first data block (D0) 610, the second data block (D1) 612, and the third data block (D2) 614 can be combined by the encoder 512 of FIG. 5 using the construct generator 508 of FIG. 5 for applying the matrix 528 of FIG. 5 for generating a polynomial 516 of FIG. 5.

In a manner similar to the polynomial encoding process 501, the coding process 601 can include the data blocks 602, the shifted data sequence 620, the double shifted data sequence 630, or combination thereof, with data shifted and combined for the first parity block (P0) 604, the second parity block (P1) 606, the third parity block (P2) 608, or combination thereof. Thus, for systems and processes with a large number of blocks such as data blocks 602, more erasures for correction, or combination thereof, a large storage capacity can be used. A reduced storage capacity can be provided by polynomial coding, for example as provided by the polynomial encoding process 501.

Figure 7:
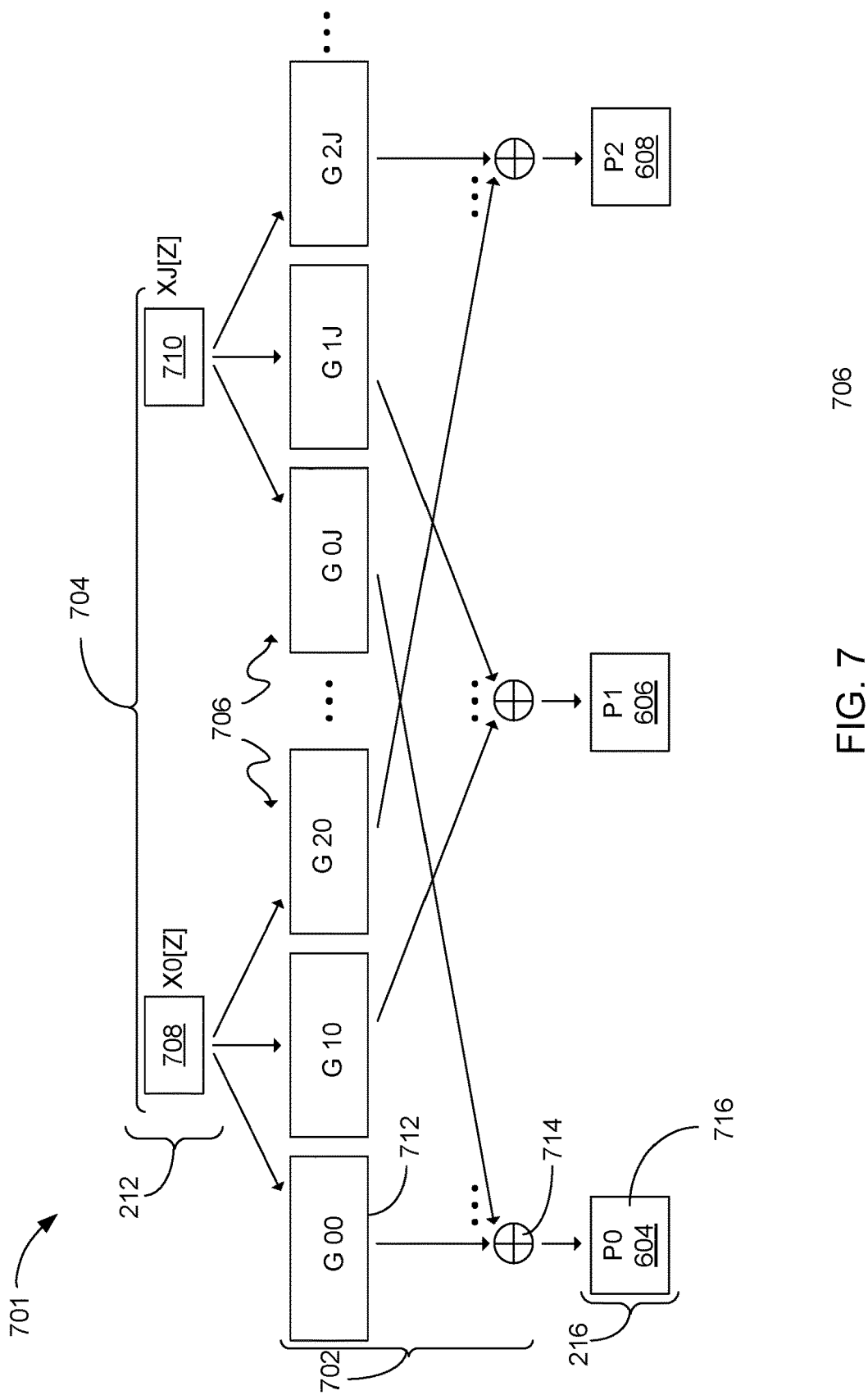
FIG. 7 is a functional block diagram of a coding process of the computing system in an embodiment of the invention.

Referring now to FIG. 7, therein is shown a functional block diagram of a coding process 701 of the computing system 100 in an embodiment of the invention. The functional block diagram of the coding process 701 can include an encoder 702 for encoding the input data blocks 704, of the storage data 212, with polynomials. The encoder 702 can be implemented with a cross-point switch, a shift register, sequential logic, or a combination thereof.

For the coding process 701 including encoding, a generator matrix 706, which can be denoted as $G_{ij}$, can include polynomial entries and can be non-singular to provide recovery of erased or missing information or data such as the erasure storage data 224 of FIG. 2 or the erasure check data 228 of FIG. 2.

Hardware including circuitry, transistors, processor, cross-point switch, integrated circuit cores, sequential logic, shift-registers, or combination thereof, can be configured to implement the coding process 701, including operations such as provided by the shift encoding process 401, the polynomial encoding process 501, multiplication, "exclusive or" (XOR), or combination thereof, can be implemented with hardware including circuitry, transistors, processor, computer, integrated circuit, integrated circuit cores, sequential logic, shift-registers, or combination thereof.

The coding process 701 can include the generator matrix 706, for processing the input data blocks 704 of the same length, which can include a first data block 708 through a $J^{th}$ data block 710, including a series of bytes designated as "z". The generator matrix 706 can include entry nodes 712 can be denoted for example as $G_{ij}(z)$. The generator matrix 706 can be non-singular and combined, such as with multiplication, XOR, or combination thereof, with input data blocks 704, which can be denoted as $X_i[z]$. It is understood that the "i" designates the number of the data blocks included in the check data 216. The entry nodes 712 can be selectively coupled to summing nodes 714, such as XOR nodes that can combine the outputs of the entry nodes 712 for generating the check data 216. Each of the summing nodes 714 can be coupled to parity registers 716 that are configured to capture the first parity block (P0) 604, the second parity block (P1) 606, and the third parity block (P2) 608. It is understood that there can be a different number of the parity blocks in the check data 216.

The entry nodes 712 of the generator matrix 706 can each implement a portion of the polynomial generation that is sent to the summing nodes 714. The result passed from the summing nodes 714 can be a sequence of the first parity block (P0) 604, the second parity block (P1) 606, and the third parity block (P2) 608. The parity registers 716, which can be configured to capture the parity blocks, can be hardware registers, volatile memory, non-volatile memory, hardware sequential logic, shift registers, or a combination thereof.

The recovery of original blocks or data, parity, or combination thereof, of the coding process 701 can be implemented with operations such as provided by the shift encoding process 401, provided by "exclusive or" (XOR), for example as described in the shift encoding process 401, the polynomial encoding process 501, or combination thereof. Further, for example, the matrices 708 can include the matrix 528 of FIG. 5.

For illustrative purposes, six of the entry nodes 712 are shown to process the input data blocks 704 although it is understood that any number or type of the entry nodes 712 may be included. For example, ellipses are shown to indicate additional ones of the entry nodes 712, the summing nodes 714, or combination thereof.

Figure 8:
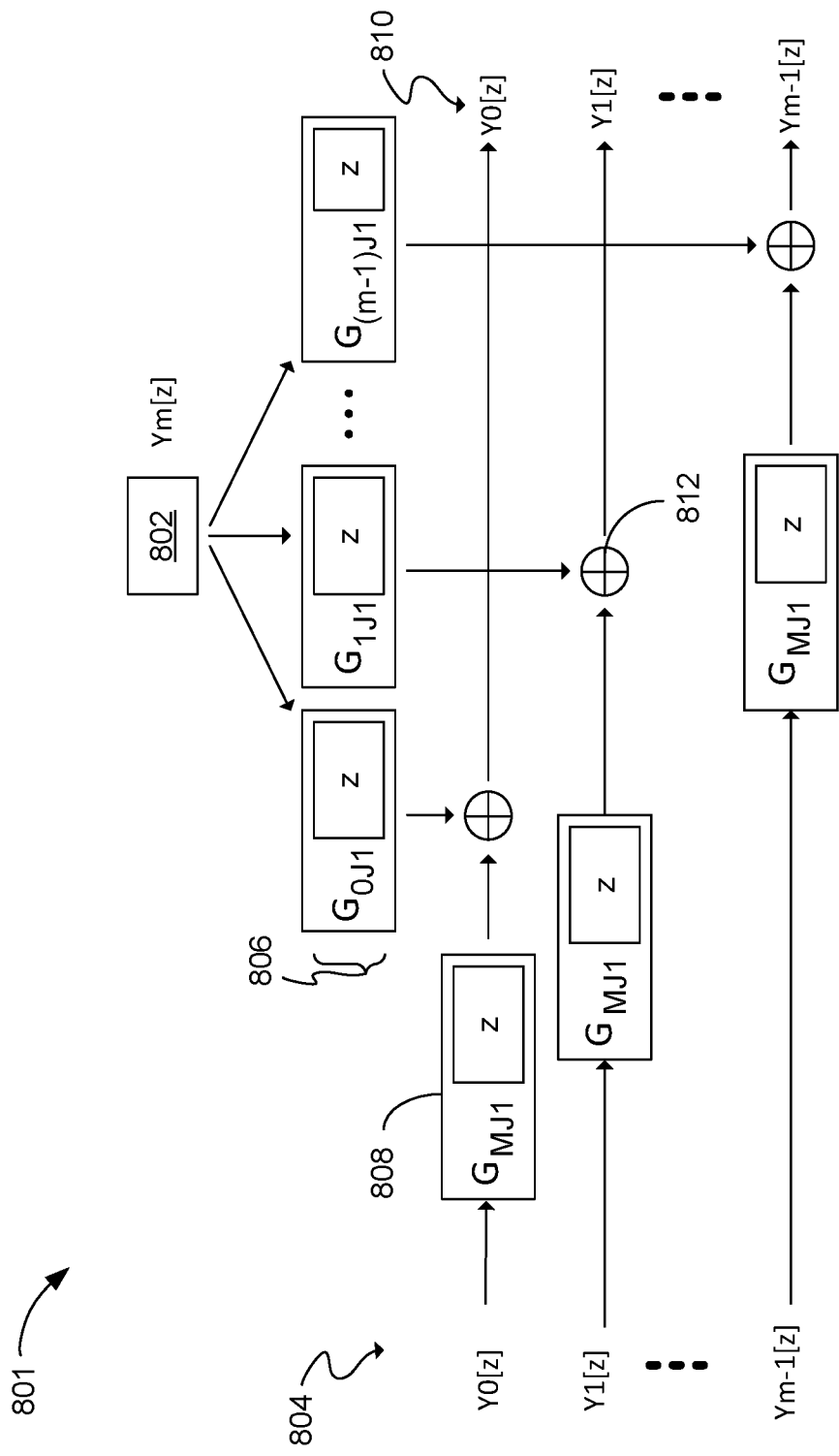
FIG. 8 is an example of a decoding process of the computing system in an embodiment of the invention.

Referring now to FIG. 8, therein is shown an example of a decoding process 801 of the computing system 100 in an embodiment of the invention. The decoding process 801 can include decoding by polynomials to provide recovery of erased or missing information or data such as any data including parity or check information or data.

Hardware including circuitry, transistors, processor, computer, integrated circuit, integrated circuit cores, sequential logic, shift-registers, or combination thereof, can be configured to implement the coding process 800, including operations such as provided by the shift encoding process 401, provided by the polynomial encoding process 501, cancellation, comparison, enumeration, division, multiplication, "exclusive or" (XOR), or combination thereof.

The decoding process 801 can include identification of parity blocks 802 that are available or "not erased". Based on the identification of the parity blocks 802, the decoding process 801 can include an operation to cancel out persistent data blocks 804 that are still available. As each of the persistent data blocks 804 that are not erased is removed from the parity block 802, only the recovered data block 806 will remain and provide a replacement for the erasure storage data 224 of FIG. 2. For example, the operation can include an equation as follows:

$$P_i[z] - \Sigma_{X_j is\ available} g_{ij}(z) X_j[z] = E_{X_j is\ unavailable} g_{ij}(z) X_j[z] = Y_i[z] \quad \text{(Equation 62)}$$

Where the available parity block $P_i[z]$ is any of the parity blocks that were not erased. By summing the output of a polynomial node 806 with each of the persistent data blocks 804 that passes through a generator matrix 808, only recovered storage data 810 will remain.

The decoding process 801 can include generating matrices 808, which can be denoted as $g_{m_{j_1}}(z)$ of the recovered storage data 810, which can be denoted as $Y_i[z]$. The generating matrices 808, the recovered storage data 810, or combination thereof can include individual bytes which can be denoted as z. An erased or unknown data block, for example denoted as $X_{j_i}[z]$, can be determined by an operation such as provided by the shift encoding process 401, provided by the polynomial encoding process 501, cancellation, comparison, enumeration, division, multiplication, "exclusive or" (XOR), or combination thereof. For example, generator matrices 808 can provide the recovered storage data 810. By way of an example the recovered storage data 810 can be separated from the parity blocks 802 by an "exclusive or" (XOR) 812 coupled between the polynomial node 806 and the generating matrices 808.

The persistent data blocks 804 can be cancelled out from the parity blocks 802 to provide the recovered storage data

810. Equations can be combined to cancel out additional of the persistent data blocks 804 denoted by ellipses in the persistent data blocks 804 and the recovered storage data 810 to indicate additional equations for the persistent data blocks 804. The decoding process 801 can include an operation such as polynomial division to provide an equation with only one of the erased or unknown data blocks.

A matrix, such as the matrix 528 of FIG. 5, a G matrix provided by the Equation 58 of FIG. 5, or combination thereof, can be constructed. A largest of polynomial entries can determine a quantity of required storage redundancy. For example, to reduce the required storage redundancy, the matrix can be constructed for different erasure tolerance requirements, described further below.

For example, for a number of redundant parity blocks equal to two, r=2, in a manner similar to the Equations 49-98 of FIG. 5.

1) Find a smallest integer, s, such that s≥$\log_2$ K+1.
2) Given a first row of a G matrix are all ones.
3) A second row of the G matrix are distinct polynomials with a largest degree small than s.

For example, for a number of redundant parity blocks equal to three, r=3.

1) Find a smallest integer, s, such that s≥$\log_2$ K+1.
2) Choose a primitive polynomial ρ(α) with degree s. All polynomials with degrees no larger than s form a finite field, denoted as GF(s). These polynomials can be enumerated by $\alpha^i$, i=0, . . . , $2^s$−1. The term $\alpha^i$ can represent polynomials. An exact polynomial can be calculated by $\alpha^i$ mod ρ(α).
3) A matrix G can be constructed by the G matrix provided by the Equation 58 of FIG. 5.
4) A storage redundancy for each of a parity block can be bounded by s(K−1) bytes.

For example, for a number of redundant parity blocks equal to four, r≥4.

1) Find a smallest integer, s, such that s≥$\log_2$ (r+K).
2) Choose a primitive polynomial ρ(α) with degree s.
3) Enumerate the elements in GF(s) by $\alpha^i$. Divide these elements into sets:
4) {$\alpha^0$, . . . , $\alpha^{r-1}$}, which contains first r elements, represented as {$x_1$, . . . , $x_r$}
5) {$\alpha^r$, . . . , $\alpha^{r+K-1}$}, which contains remaining r elements, represented as {$y_1$, . . . , $y_K$}

A matrix G can be constructed, in a manner similar to Equation 60 of FIG. 5, as follows:

$$\begin{bmatrix} \frac{1}{x_1+y_1} & \frac{1}{x_1+y_2} & \cdots & \frac{1}{x_1+y_K} \\ \frac{1}{x_2+y_1} & \frac{1}{x_2+y_2} & \cdots & \frac{1}{x_2+y_K} \\ \vdots & \vdots & \ddots & \vdots \\ \frac{1}{x_r+y_1} & \frac{1}{x_r+y_2} & \cdots & \frac{1}{x_r+y_K} \end{bmatrix}$$ (Equation 60)

A storage redundancy for each of a parity block can be bounded by s(K−1) bytes.

Figure 9:
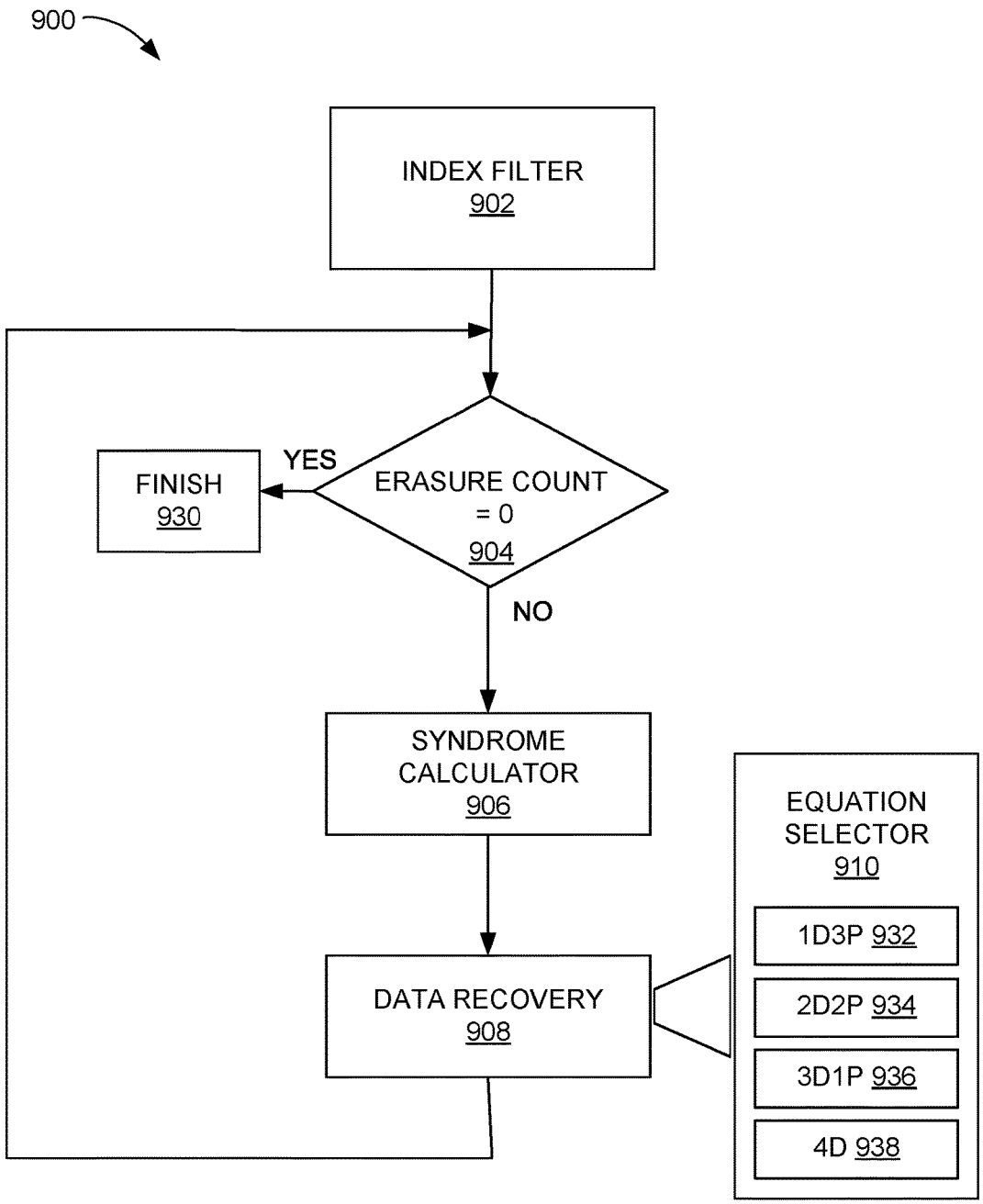
FIG. 9 is an example of a recursive decoding process of the computing system in an embodiment of the invention.

Referring now to FIG. 9, therein is shown an example of a recursive decoding process 901 of the computing system 100 in an embodiment of the invention. The recursive decoding process 901 can include the shift decoder 334 of FIG. 3, the polynomial decoder 336 of FIG. 3, or a combination thereof, to provide recovery of erasure storage data 224 of FIG. 2, the erasure check data 228 of FIG. 2, or a combination thereof.

The recursive decoding process 901 can be implemented in hardware including electronic circuitry, transistors, integrated circuits, an integrated circuit core, a processor, electronic passive devices, or combination thereof. The recursive decoding process 901 can also be implemented with the hardware operating software, machine code, firmware, embedded code, application software, or combination thereof.

The recursive decoding process 901 can include an index filter 902, an erasure counter 904, a syndrome calculator 906, a data recovery block 908, or combination thereof. The data recovery block 908 can include equation selector 910. The index filter 902, the erasure counter 904, the syndrome calculator 906, the data recovery block 908, or combination thereof, can implemented in hardware including electronic circuitry, transistors, integrated circuits, an integrated circuit core, a processor, electronic passive devices, or combination thereof, or can be implemented with the hardware operating software, machine code, firmware, embedded code, application software, or combination thereof.

The index filter 902 can provide indices of the erasure storage data 224, the erasure check data 228, or combination thereof, for recovering the recovered data 330 of FIG. 3. Erasures, missing blocks, or erased blocks, such as the data errors 310 of FIG. 3 of the array of storage devices 136 of FIG. 3, the erasure storage data 224, the erasure check data 228, or combination thereof, can be indexed for recovery. The index filter 902 can provide the indices and check blocks to the erasure counter 904.

The erasure counter 904 can determine a number of remaining erasures based on the indices and check blocks from the index filter 902. The erasure counter 904 can determine whether the number of remaining erasures is zero (0). Based on the number of remaining erasures equal to zero (0), the erasure counter 904 can send the recursive decoding process 901 to a finish process 930. The finish process 930 can stop, end, terminate, complete, or finish the recursive decoding process 901.

Based on the number or remaining erasures other than zero (0), the erasure counter 904 provides the number or remaining erasures and can pass the indices and check blocks, to the syndrome calculator 906. The syndrome calculator 906 can calculate and update syndromes based on the check blocks, for example calculating syndromes Y from parity blocks. The syndrome calculator 906 can provide the syndromes to the data recovery block 908.

The data recovery block 908 can recover a data block with a largest index based on the syndrome of the syndrome calculator 906. The data recovery block 908 can access the equation selector 910 based on the number of remaining erasures. For example, equation selector 910 can resolve erasure patterns such as one data erasure and three parity erasures equation 932, two data erasures and two parity erasures equation 934, three data erasures and one parity erasure equation 936, or four data erasures equation 938. It is understood that the equation selector 910 can access additional equations based on the erasure tolerance input 410 of FIG. 4, which can be configured to correct up to 31 erasures in the storage data 212 of FIG. 2.

The data recovery block 908 can recover the remaining erasure and send the recursive decoding process 901 to the erasure counter 904 to determine whether the number of remaining erasures is zero (0). Based on the number of remaining erasures equal to zero (0), the erasure counter 904 can send the recursive decoding process 901 to a finish process 930. The finish process 930 can stop, end, terminate, complete, or finish the recursive decoding process 901.

For illustrative purposes, data recovery block 908 is shown with four erasure equations, although it is understood that any number of erasure equations may be provided. At least some other erasure equations can be viewed as special events of the equation selector 910. Further, the data recovery block 908 can utilize any decoder including the shift decoder 334, the polynomial decoder 336, or combination thereof.

It has been discovered that the recursive decoding process 901 with the equation selector 910 can recover erasures such as the data errors 310, the erasure storage data 224, the erasure check data 228, or combination thereof. The recursive decoding process 901 can recover the erasures based on resolving erasure patterns based on the remaining erasures.

Figure 10:
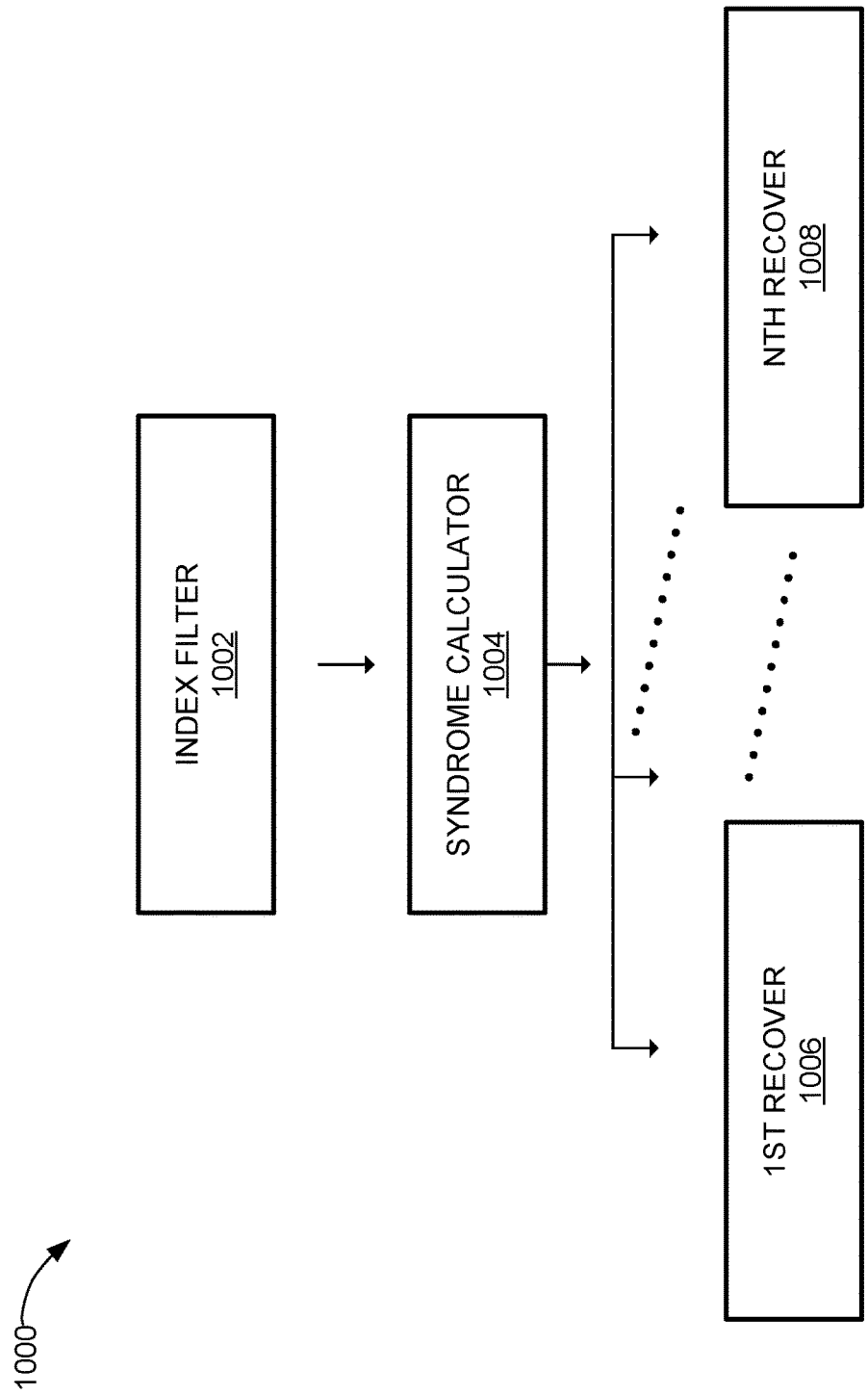
FIG. 10 is an example of a parallel decoding process of the computing system in an embodiment of the invention.

Referring now to FIG. 10, therein is shown an example of a parallel decoding process 1000 of the computing system 100 in an embodiment of the invention. The parallel decoding process 1000 can include the shift decoder 334 of FIG. 3, the polynomial decoder 336 of FIG. 3, or combination thereof, provide recovery of erased or missing information or data such as any data including parity or check information or data.

The parallel decoding process 1000 can be implemented in hardware including electronic circuitry, transistors, integrated circuits, an integrated circuit core, a processor, electronic passive devices, or combination thereof. The parallel decoding process 1000 can also be implemented with the hardware operating software, machine code, firmware, embedded code, application software, or combination thereof.

The parallel decoding process 1000 can include an index filter 1002, a syndrome calculator 1004, a first recover process 1006, an Nth recover process 1008, or combination thereof. The index filter 1002, the calculate process 1004, the first recover process 1006, the Nth recover process 1008, or combination thereof, can implemented in hardware including electronic circuitry, transistors, integrated circuits, an integrated circuit core, a processor, electronic passive devices, or combination thereof, or can be implemented with the hardware operating software, machine code, firmware, embedded code, application software, or combination thereof.

The index filter 1002 can provide indices of erased data blocks, check blocks such as parity blocks associated with the erased data blocks, or combination thereof, for recovering the erased data blocks. Erasures, missing blocks, or erased blocks, such as the data errors 310 of FIG. 3 of the hard disk drives 134 of FIG. 1, the erasure storage data 224 of FIG. 2, the erasure check data 228 of FIG. 2, or combination thereof, can be indexed for recovery. The index process 1002 can provide the indices and check blocks to the calculate process 1004.

The calculate process 1004 can receive indices of erased data blocks, check blocks such as parity blocks associated with the erased data blocks, or combination thereof, from the index filter 1002. The calculate process 1004 can calculate and update syndromes based on the check blocks, for example calculating syndromes Y from parity blocks. The calculate process 1004 can provide the syndromes to the first recover process 1006, the Nth recover process 1008, or combination thereof.

The first recover process 1006 and the Nth recover process 1008 can recover a data block based on the syndrome of the calculate process 1004. The first recover process 1006 and the Nth recover process 1008 can operate in parallel to one another and utilize various different decoders.

The parallel coding process 1000 can provide parallel coding without assuming $a<b<c<d$, without recovering a data block with a largest index, or combination thereof. A recovery equation for $X_c$ is as follows:

$$Y_0 = P_{k_0} \oplus_{i \neq a, b} X_i^{k_0 i} \quad \text{(Equation 63)}$$

$$Y_1 = P_{k_1} \oplus_{i \neq a, b} X_i^{k_1 i} \quad \text{(Equation 64)}$$

$$Y_2 = P_{k_2} \oplus_{i \neq a, b} X_i^{k_2 i} \quad \text{(Equation 65)}$$

Multiple lines, such as six (6), can be used to cancel out $X_a$ and $X_b$, as follows:

$$\begin{aligned} &Y_0^{-k_0 c} \oplus Y_0^{(k_2-k_1)(b-a)-k_0 c} \oplus Y_1^{-k_0(c-b)-k_1 b} \oplus \\ &Y_1^{k_2(b-a)-k_0(c-a)-k_1 b} \oplus Y_2^{-k_0(c-a)-k_2 a} \oplus \\ &Y_1^{-k_0(c-b)-k_1(b-a)-k_2 a} = X_c \oplus X_c^{(k_1-k_0)(c-b)} \oplus \\ &X_c^{(k_2-k_0)(c-a)} \oplus X_c^{(k_2-k_1)(b-a)} \oplus \\ &X_c^{k_2(c-a)-k_1(b-a)-k_0(c-b)} \oplus X_c^{k_2(b-a)+k_1(c-b)-k_0(c-a)} \end{aligned} \quad \text{(Equation 66)}$$

The above equations work for $a<c<b$ and $c<a<b$, but cannot guarantee that terms $X_c^{(k_1-k_0)(c-b)}$, $X_c^{(k_2-k_0)(c-a)}$, $X_c^{(k_2-k_1)(b-a)}$, $X_c^{k_2(c-a)-k_1(b-a)-k_0(c-b)}$, $X_c^{k_2(b-a)+k_1(c-b)-k_0(c-a)}$ are sequences obtained by shifting $X_c$ to the right by positive units. This can provide an initial condition to start decoding for $X_c$. Therefore, an additional step is included:

$$\begin{aligned} \text{Pick offset} = \min\{&0, (k_1-k_0)(c-b), (k_2-k_0)(c-a), (k_2-k_1) \\ &(b-a), k_2(c-a)-k_1(b-a)-k_0(c-b), k_2(b-a)+k_1 \\ &(c-b)-k_0(c-a)\} \end{aligned} \quad \text{(Equation 67)}$$

Thus, for Y sequences, shift the sequences to the right by |offset|. For example, shifts in $Y_i$ are as follows:

TABLE 3

| $\text{shift}_y$ | value |
|---|---|
| 1 | $k_0 c$ − offset |
| 2 | $k_0 c - (k_2 - k_1)(b - a)$ − offset |
| 3 | $k_0(c - b) + k_1 b$ − offset |
| 4 | $k_0(c - a) + k_1 b - k_2(b - a)$ − offset |
| 5 | $k_0(c - a) + k_2 a$ − offset |
| 6 | $k_0(c - b) + k_1(b - a) + k_2 a$ − offset |

For illustrative purposes, the parallel decoding process 1000 is shown with the first recover process 1006 and the Nth recover process 1008, although it is understood that any number of recover processes may be used. Parallel decoding is not limited to the number of recover processes or decoders. The parallel decoding process 1000 can utilize any decoder including the shift decoder 334, the polynomial decoder 336, or combination thereof.

It has been discovered that the parallel decoding process 1000 with the first recover process 1006 and the Nth recover process 1008 can concurrently recover erasures such as the data errors 310, the erasure storage data 224, the erasure check data 228, or combination thereof. The parallel decoding process 1000 can recover the erasures based on resolving erasure operating in parallel and utilizing various different decoders.

Figure 11:
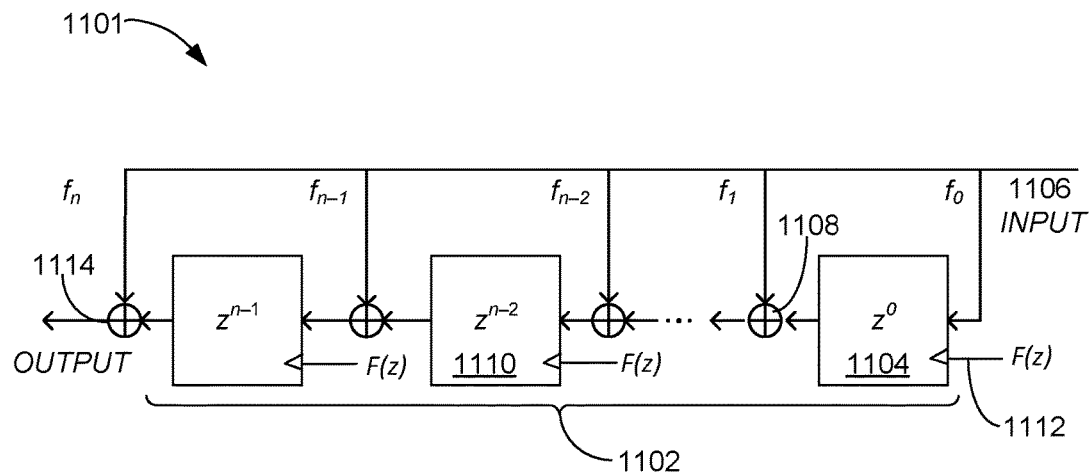
FIG. 11 is a functional block diagram of a polynomial processing device of the computing system in an embodiment of the invention.

Referring now to FIG. 11, therein are shown a functional block diagram of a polynomial processing device 1101 of the computing system 100 in an embodiment of the invention. The functional block diagram of the polynomial processing device 1101 depicts a register array 1102 configured as a shift register for multiplying a polynomial by a function $f(z)$.

The register array 1102 can include a receiving stage register 1104 coupled to an input bus 1106. The input bus 1106 can carry the polynomial, such as G as defined by equation 57, listed above. The receiving stage register 1104 can also be coupled to a summing node 1108, such as a logical exclusive OR (XOR). The summing node 1108 can combine the output of the receiving stage register 1104 with the input bus 1106 in an unregistered state.

The output of the summing node 1108 can be coupled to a shifting stage register 1110, which can be configured similar to the receiving stage register 1104. The entire register array 1402 can be clocked by a clock function $f(z)$ 1112. An output 1114 of the a polynomial processing device 1101 can be the input bus 1106 polynomial multiplied by the clock function $f(z)$ 1112 and can be used in the generation of the check data 216 of FIG. 2.

It has been discovered that the complex operation of multiplying a polynomial by a function can be achieved through the polynomial processing device 1101. The register array 1102 is shown as a single layer register, but it is understood that the receiving stage register 1104 and the shifting stage register 1110 can be parallel registers capturing a number of bits of the input bus 1106.

Figure 12:
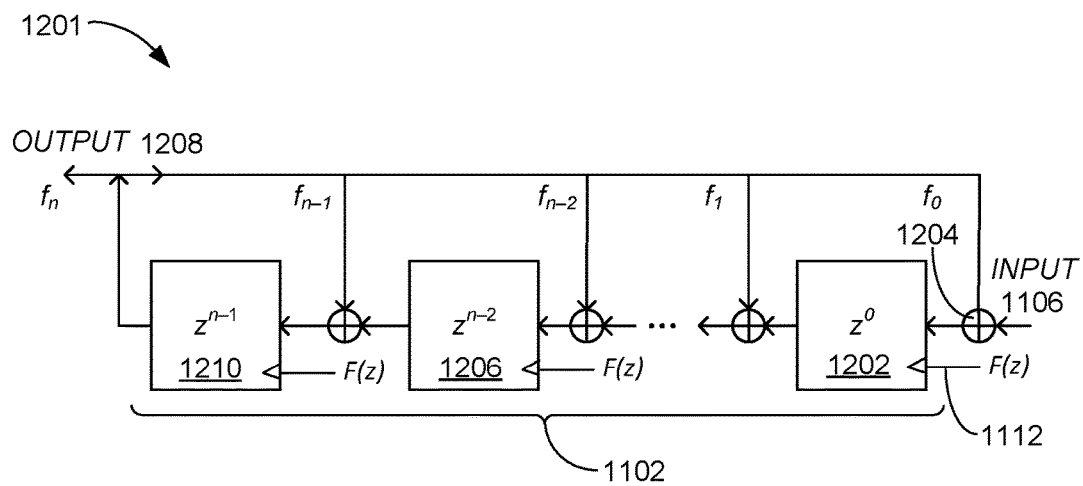
FIG. 12 is a functional block diagram of a polynomial processing device of the computing system in an embodiment of the invention.

FIG. 12, therein is shown a functional block diagram of a polynomial processing device 1201 of the computing system 100 in an embodiment of the invention. The functional block diagram of a polynomial processing device 1201 depicts the register array 1102 configured as a shift register for dividing a polynomial by a function $f(z)$.

The register array 1102 can include an input stage register 1202 coupled to an input summing node 1204, such as a logical exclusive OR (XOR), which is coupled to the input bus 1106. The input bus 1106 can carry the polynomial, such as G as defined by equation 57, listed above. The input stage register 1202 can also be coupled to the summing node 1204 of a next stage register 1206. The summing node 1204, coupled to the input stage register 1202, can combine the input bus 1106 in an unregistered state and an output function $f_n$ 1208 of an output stage register 1210. The output function $f_n$ 1208 can be an input to each of the input summing node 1204 in the polynomial processing device 1201

Each stage of the register array 1102 can be configured in common, with input summing node 1204 coupled to the input stage register 1202, the next stage register 1206, or the output stage register 1210. The entire register array 1102 can be clocked by a clock function $f(z)$ 1112. An output 1114 of the a polynomial processing device 1101 can be the input 1106 polynomial multiplied by the clock function $f(z)$ 1112 and can be used in the data recovery of the erasure storage data 224 of FIG. 2, the erasure check data 228 of FIG. 1, or a combination thereof.

It has been discovered that the complex operation of dividing a polynomial by a function can be achieved through the polynomial processing device 1201. The register array 1102 is shown as a single layer register, but it is understood that the input stage register 1202, the next stage register 1206, and the output stage register 1210 can be parallel registers capturing a number of bits of the input bus 1106.

Figure 13:
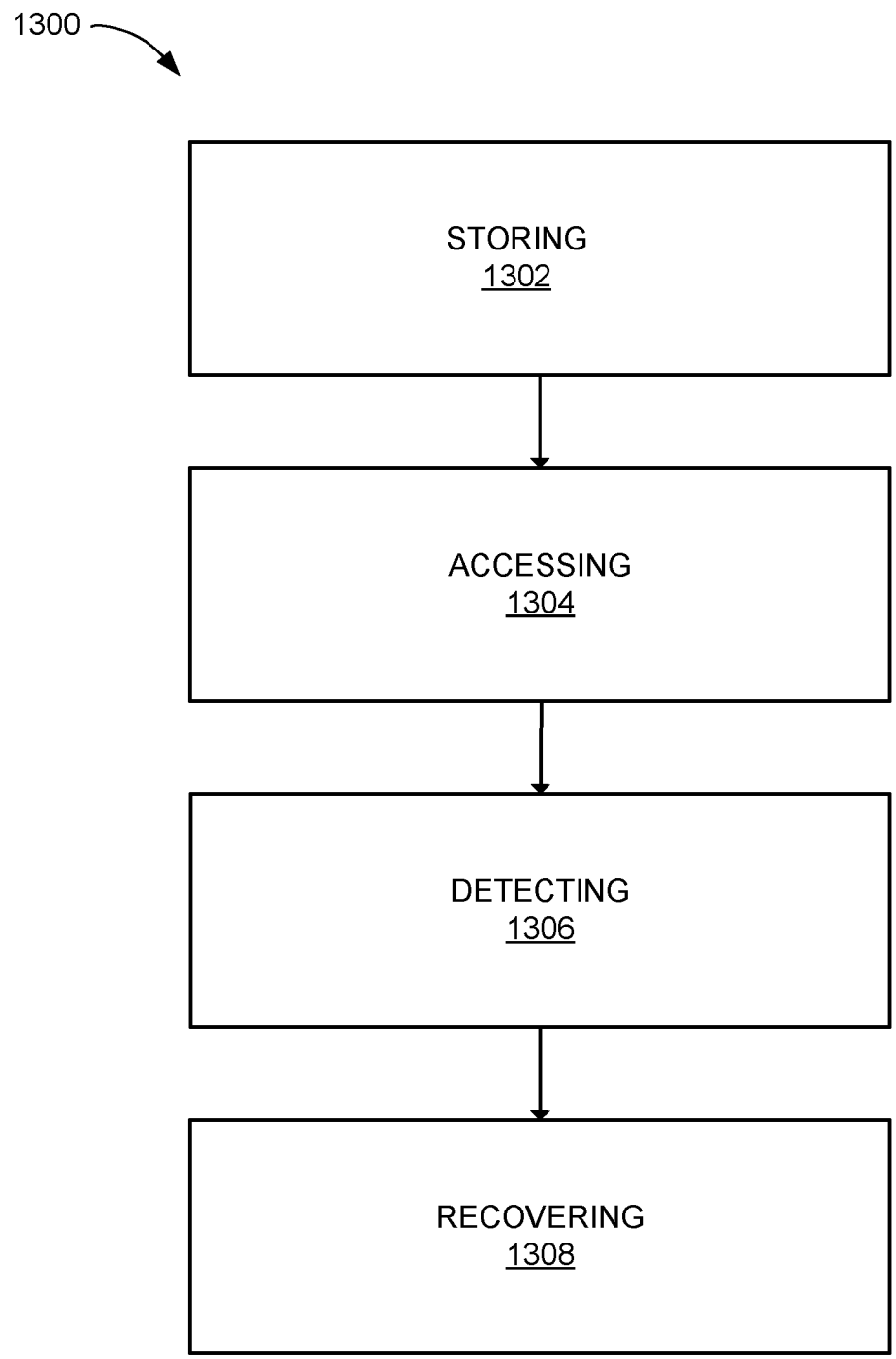
FIG. 13 is a flow chart of a method of operation of a computing system in an embodiment of the present invention.

Referring now to FIG. 13, therein is shown a flow chart of a method 1300 of operation of the computing system 100 in a further embodiment of the present invention. The method 1300 includes: storing storage data and check data in an array of storage devices in a block 1302; accessing the storage data from the array of storage devices in a block 1304; detecting an erasure storage data, an erasure check data, or a combination thereof when the storage data is not accessible from the array of storage devices in a block 1306; and recovering the storage data from the erasure storage data, the erasure check data, or the combination thereof by applying at least one of a block of check data including a slope from the check data in a block 1308.

storing storage data and check data in an array of storage devices; accessing the storage data from the array of storage devices; detecting an erasure storage data, an erasure check data, or a combination thereof when the storage data is not accessible from the array of storage devices; and recovering the storage data from the erasure storage data, the erasure check data, or the combination thereof by applying at least one of a block of check data including a slope from the check data The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
   an array of storage devices configured to store storage data and check data; and
   a storage engine, coupled to the array of storage devices, configured to:
      access the storage data,
      detect an erasure storage data, an erasure check data, or a combination thereof when the storage data is not accessible from the array of storage devices, and
      recover the storage data from the erasure storage data, the erasure check data, or the combination thereof by applying at least one of a block of check data, including a slope from the check data, by a shift encoding process including an exclusive OR (XOR) of the storage data and the block of check data, along the slope, and
      wherein the shift encoding process includes:
      an input buffer for aligning the storage data and the block of the check data,
      an index generator configured to map the storage data into the input buffer,
      a length counter configured to monitor the length of the storage data aligned in the input buffer,
      a slope generator configured to establish the slope of the block of the check data, and
      a tolerance target input configured to determine the number of blocks of the check data required for error correction.

2. The system as claimed in claim 1 wherein the storage engine is configured to generate the check data by generating a first parity block with a first slope and a second parity block with a second slope different from the first slope.

3. The system as claimed in claim 1 wherein the storage engine is configured to generate the check data by shift encoding a first parity block with a first slope and a second parity block with a second slope different from the first slope.

4. The system as claimed in claim 1 wherein the storage engine is configured to generate the check data by polynomial encoding a first parity block with a row of polynomials and a second parity block with a second row of polynomials different from the first row of polynomials.

5. The system as claimed in claim 1 wherein the storage engine is configured to recover the storage data by an exclusive or between a polynomial node and generating matrices.

6. The system as claimed in claim 1 wherein the storage engine is configured to recover the storage data including:
   an index filter configured to index the erasure storage data;
   a syndrome calculator, coupled to the index filter, configured to combine a persistent parity block and persistent data blocks with an exclusive or based on the index; and
   a data recovery block, coupled to the syndrome calculator, configured to access an equation selector for recovering four erasures from the erasure storage data.

7. The system as claimed in claim 6 wherein the storage engine is configured to recover the storage data including dividing an input polynomial, by a clock, with a register array.

8. A method of operation of a computing system comprising:
   storing storage data and check data in an array of storage devices;
   accessing the storage data from the array of storage devices;
   detecting an erasure storage data, an erasure check data, or a combination thereof when the storage data is not accessible from the array of storage devices;
   recovering the storage data from the erasure storage data, the erasure check data, or the combination thereof by applying at least one of a block of check data, including a slope from the check data, by a shift encoding process including an exclusive OR (XOR) of the storage data and the block of check data, along the slope; and
   wherein:
   the shift encoding process includes:
   aligning the storage data and the block of the check data, in an input buffer;
   mapping the storage data into the input buffer by an index generator;
   monitoring the length of the storage data aligned in the input buffer by a length counter;
   establishing the slope of the block of the check data by a slope generator; and
   determining the number of the blocks of the check data required for error correction.

9. The method as claimed in claim 8 further comprising generating the check data by generating a first parity block with a first slope and a second parity block with a second slope different from the first slope.

10. The method as claimed in claim 8 further comprising generating the check data by shift encoding a first parity block with a first slope and a second parity block with a second slope different from the first slope.

11. The method as claimed in claim 8 further comprising generating the check data by polynomial encoding a first parity block with a row of polynomials and a second parity block with a second row of polynomials different from the first row of polynomials.

12. The method as claimed in claim 8 wherein recovering the storage data includes extracting persistent data blocks from the check data by an exclusive or between a polynomial node and generating matrices.

13. The method as claimed in claim 8 wherein recovering the storage data includes:
   indexing the erasure storage data;
   combine a persistent parity block and persistent data blocks with an exclusive or based on the index; and
   accessing an equation selector for recovering four erasures from the erasure storage data.

14. The method as claimed in claim 8 wherein recovering the storage data includes dividing an input polynomial, by a clock, with a register array.

15. A non-transitory computer readable medium including instructions for execution, the medium comprising:
   storing storage data and check data in an array of storage devices;
   accessing the storage data from the array of storage devices;
   detecting an erasure storage data, an erasure check data, or a combination thereof when the storage data is not accessible from the array of storage devices; and
   recovering the storage data from the erasure storage data, the erasure check data, or the combination thereof by applying at least one of a block of check data, including a slope from the check data, by a shift encoding process including an exclusive OR (XOR) of the storage data and the block of check data, along the slope; and
   wherein:
   the shift encoding process includes:
   aligning the storage data and the block of the check data in an input buffer;
   mapping the storage data into the input buffer by an index generator;
   monitoring the length of the storage data aligned in the input buffer by a length counter;
   establishing the slope of the block of the check data by a slope generator; and
   determining the number of the blocks of the check data required for error correction.

16. The medium as claimed in claim 15 further comprising generating the check data by generating a first parity block with a first slope and a second parity block with a second slope greater than the first slope.

17. The medium as claimed in claim 15 further comprising generating the check data by shift encoding a first parity block with a first slope and a second parity block with a second slope different from the first slope.

18. The medium as claimed in claim 15 further comprising generating the check data by polynomial encoding a first parity block with a row of polynomials and a second parity block with a second row of polynomials different from the first row of polynomials.

19. The medium as claimed in claim 15 wherein recovering the storage data including:
   indexing the erasure storage data;
   combine a persistent parity block and persistent data blocks with an exclusive or based on the index; and
   accessing an equation selector for recovering four erasures from the erasure storage data.

20. The medium as claimed in claim 15 wherein recovering the storage data including dividing an input polynomial by a clock.

* * * * *